(12) United States Patent
Ford et al.

(10) Patent No.: US 9,761,621 B2
(45) Date of Patent: Sep. 12, 2017

(54) COLOR FILTER ARRAY, IMAGERS AND SYSTEMS HAVING SAME, AND METHODS OF FABRICATION AND USE THEREOF

(71) Applicant: MICRON TECHNOLOGY, INC., Boise, ID (US)

(72) Inventors: Loriston Ford, Nampa, ID (US); Ulrich C. Boettiger, Boise, ID (US)

(73) Assignee: Micron Technology, Inc., Boise, ID (US)

(*) Notice: Subject to any disclaimer, the term of this patent is extended or adjusted under 35 U.S.C. 154(b) by 306 days.

(21) Appl. No.: 14/078,806

(22) Filed: Nov. 13, 2013

(65) Prior Publication Data
US 2014/0061836 A1 Mar. 6, 2014

Related U.S. Application Data

(62) Division of application No. 11/510,703, filed on Aug. 28, 2006, now Pat. No. 8,610,806.

(51) Int. Cl.
*H01L 27/146* (2006.01)

(52) U.S. Cl.
CPC .. *H01L 27/14625* (2013.01); *H01L 27/14621* (2013.01); *H01L 27/14623* (2013.01); *H01L 27/14627* (2013.01); *H01L 27/14632* (2013.01); *H01L 27/14685* (2013.01); *H01L 27/14687* (2013.01)

(58) Field of Classification Search
CPC ......... H01L 27/14625; H01L 27/14685; H01L 27/14627; H01L 27/14623; H01L 27/14632; H01L 27/14621; H01L 27/14687
See application file for complete search history.

(56) References Cited

U.S. PATENT DOCUMENTS

| | | |
|---|---|---|
| 5,074,649 A | 12/1991 | Hamanaka |
| 5,466,926 A | 11/1995 | Sasano et al. |
| 5,536,455 A | 7/1996 | Aoyama et al. |
| 5,592,223 A * | 1/1997 | Takamura ............ H04N 5/2254 348/340 |
| 6,127,670 A * | 10/2000 | Miyahara .......... H01L 27/14645 257/435 |
| 6,140,630 A | 10/2000 | Rhodes |
| 6,204,524 B1 | 3/2001 | Rhodes |
| 6,271,900 B1 | 8/2001 | Li |
| 6,310,366 B1 | 10/2001 | Rhodes et al. |
| 6,326,652 B1 | 12/2001 | Rhodes |
| 6,333,205 B1 | 12/2001 | Rhodes |
| 6,376,868 B1 | 4/2002 | Rhodes |
| 6,605,851 B2 | 8/2003 | Kim |
| 6,734,031 B2 | 5/2004 | Shizukuishi |
| 6,852,591 B2 | 2/2005 | Rhodes |
| 7,012,754 B2 | 3/2006 | Boettiger et al. |
| 7,068,432 B2 | 6/2006 | Boettiger et al. |
| 2001/0052629 A1 | 12/2001 | Assadi et al. |
| 2002/0176037 A1 | 11/2002 | Li |
| 2003/0063204 A1 | 4/2003 | Suda |

(Continued)

*Primary Examiner* — Nhan T Tran
(74) *Attorney, Agent, or Firm* — Perkins Coie LLP

(57) ABSTRACT

A pixel cell with a photosensitive region formed in association with a substrate, a color filter formed over the photosensitive region, the color filter comprising a first material layer and a second material layer formed in association with the first shaping material layer.

14 Claims, 20 Drawing Sheets

(56) References Cited

U.S. PATENT DOCUMENTS

| | | |
|---|---|---|
| 2003/0063210 A1 | 4/2003 | Tsuboi |
| 2003/0210462 A1 | 11/2003 | Freese et al. |
| 2005/0280012 A1 | 12/2005 | Boettiger et al. |
| 2006/0027887 A1 | 2/2006 | Boettiger et al. |
| 2006/0187381 A1 | 8/2006 | Yokozawa |
| 2006/0197006 A1* | 9/2006 | Kochi ............... H01L 27/14621 250/208.1 |
| 2007/0008421 A1* | 1/2007 | Wu .................. H01L 27/14627 348/340 |
| 2007/0158532 A1* | 7/2007 | Lin .................. H01L 27/14685 250/208.1 |
| 2007/0221616 A1 | 9/2007 | Wu et al. |
| 2007/0292806 A1 | 12/2007 | Hsu |
| 2008/0011936 A1* | 1/2008 | Kuo .................. H01L 27/14627 250/208.1 |

\* cited by examiner

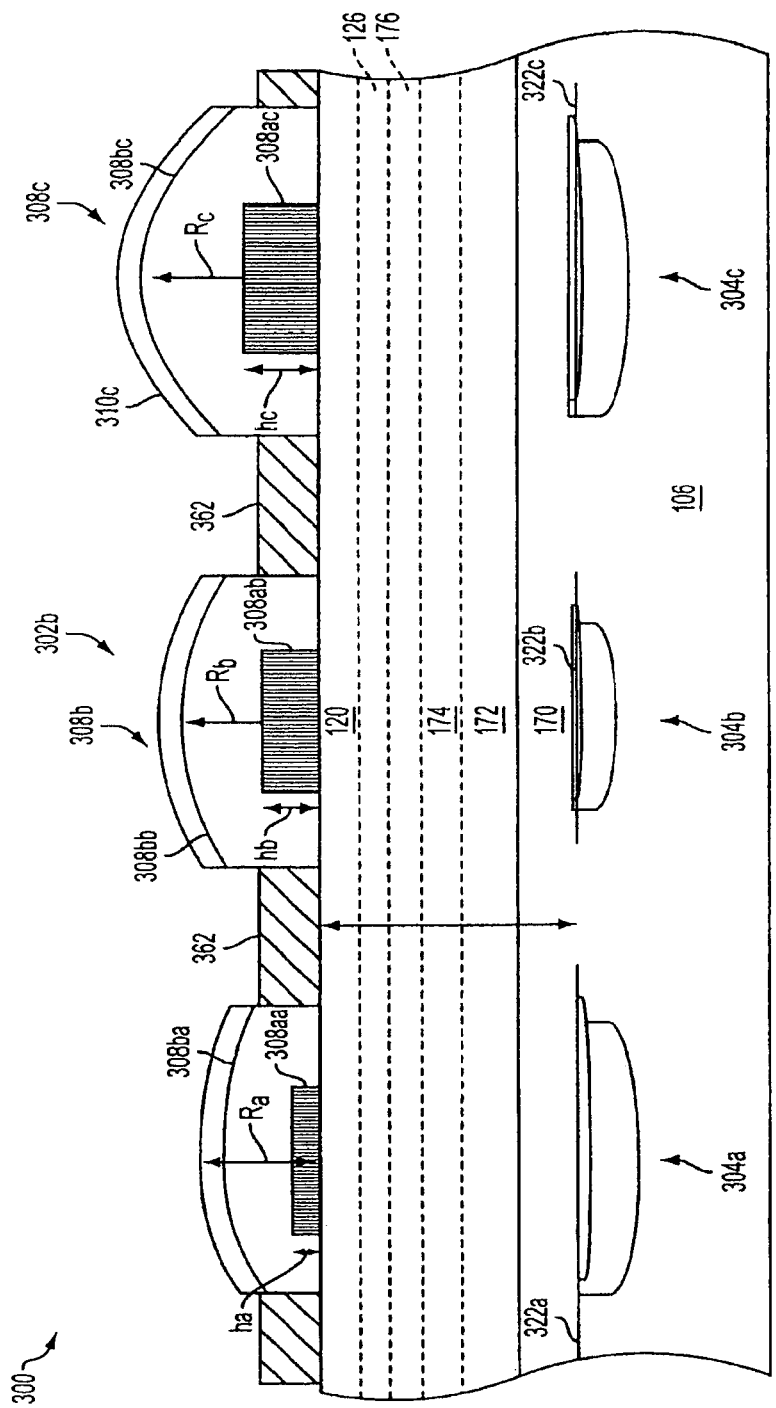

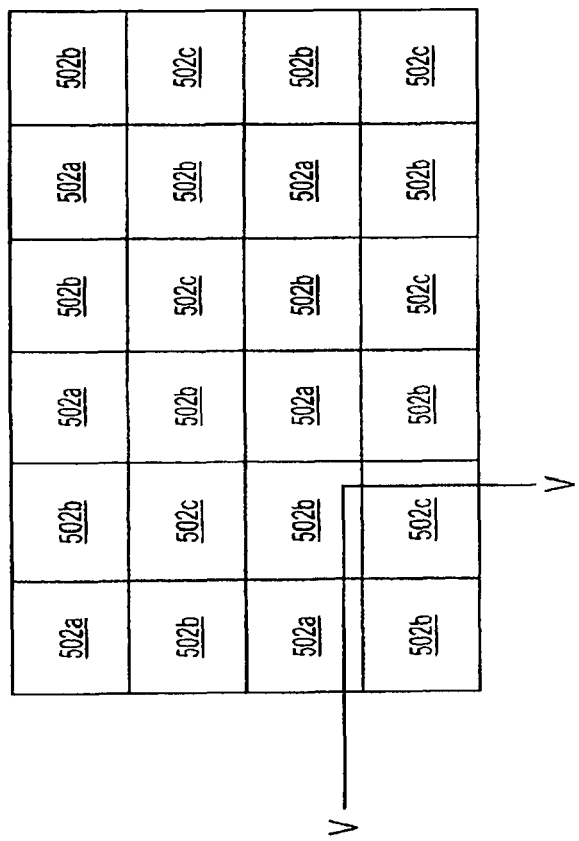

COLOR FILTER ARRAY, IMAGERS AND SYSTEMS HAVING SAME, AND METHODS OF FABRICATION AND USE THEREOF

This application is a divisional of U.S. application Ser. No. 11/510,703, filed on Aug. 28, 2006, the entire disclosure of which is incorporated herein by reference.

FIELD OF THE INVENTION

Embodiments of the invention relate generally to semiconductor devices and in particular to imager devices and methods of forming and using the same.

BACKGROUND OF THE INVENTION

Imager devices, including charge coupled devices (CCD), complementary metal oxide semiconductor (CMOS) sensors, and others have commonly been used in photo-imaging applications. A CMOS imager circuit includes a focal plane array of pixel cells, each one of the cells including a photosensitive region (or photosensor), for example, a photogate, photoconductor or a photodiode for accumulating photo-generated charge in the specified portion of the substrate. Each pixel cell has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the functions of: (1) photon to charge conversion; (2) accumulation of image charge; (3) resetting the storage region to a known state; (4) transfer of charge to the storage region; (5) selection of a pixel for readout; and (6) output and amplification of signals representing pixel reset level and pixel charge. Photo charge may be amplified when it moves from the initial charge accumulation region to the storage region. The charge at the storage region is typically converted to a pixel output voltage by a source follower output transistor.

Examples of CMOS imaging circuits, processing steps thereof, and detailed descriptions of the functions of various CMOS elements of an imaging circuit are described, for example, in U.S. Pat. No. 6,140,630; U.S. Pat. No. 6,376,868; U.S. Pat. No. 6,310,366; U.S. Pat. No. 6,326,652; U.S. Pat. No. 6,204,524; U.S. Pat. No. 6,333,205; and U.S. Pat. No. 6,852,591, all of which are assigned to Micron Technology, Inc. The disclosures of each of the foregoing are hereby incorporated by reference in their entirety.

The use of microlenses significantly improves the photosensitivity of the imaging device by collecting light from a large light collecting area and focusing it onto a small photosensitive area of the photosensor. Each photosensor is typically fabricated to absorb a wavelength of light associated for a particular color. Color filter arrays, typically formed below the microlenses, have been used to filter wavelengths of light associated with particular colors that are not intended to strike the underlying photosensor. Conventional color filter arrays are patterned and reflowed over respective photosensors. Microlens precursor blocks are subsequently patterned on the color filter array, and reflowed to produce a hemi-spherical shape to the overall microlens.

During reflow of the color filter array, however, the patterned structures typically contract resulting in an uneven surface on which the microlens precursor blocks are formed. Contraction of up to 10% of the materials used to form the color filters is not uncommon. Microlenses subsequently formed over the contracted and uneven color filter array may have uncontrollably shifted focal points relative to a center of underlying photosensors.

The uncontrollably shifted focal points of the microlenses may result in increased cross-talk or a reduced efficiency of light capture. "Cross-talk" results when off-axis wavelengths of light strike a microlens or color filter at an obtuse angle of incidence. The off-axis wavelengths of light pass through material layers and miss the intended photosensors, and instead strike adjacent photosensors. Reduced light conversion efficiency may occur when the off-axis wavelengths strike a less than optimal spot on an intended photosensor. The problem of contracted color filter arrays is exacerbated by asymmetrical pixel cell architectures that have recently been proposed to increase photosensor array density. Asymmetrical pixel cell architecture demands the precise placement of color filters and overlying microlenses to focus light onto the photosensor. The slightest contraction of the color filter array and overlying microlenses may have detrimental effects upon the incidence of cross-talk.

Additionally, spaces or gaps between the color filters in the array may cause subsequently formed microlens precursors to assume a "bowed" or uneven topmost surface. Once the microlens precursors are patterned and reflowed, the microlenses shift, relative to a center of the underlying photosensor, into the bowed area, which may also result in increased cross-talk.

Accordingly, it is desirable to form color filter arrays having a substantially gapless surface for overlying microlenses formed thereon. By reducing the gapping between color filters in the color filter array, an overlying microlens array may have a reduced number of microlenses with shifted focal points. Additionally, due to the inevitability of shifting microlenses, it is desirable to control the shifting by controlling the shapes of the underlying color filters.

BRIEF DESCRIPTION OF THE DRAWINGS

FIG. 8 illustrates a partial cross-sectional view of an imager device constructed in accordance with a seventh embodiment of the invention;

FIGS. 10A-10B illustrates a partial cross-sectional view of an imager device constructed in accordance with a ninth embodiment of the invention;

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made. The term "substrate" used in the following description may include any supporting structure including, but not limited to, a semiconductor substrate that has an upper semiconductor substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

The term "pixel cell," as used herein, refers to a photo-element unit cell containing a photosensitive region for converting photons to an electrical signal as may be employed by an imager device. Although the pixel cells are illustrated herein as CMOS four-transistor (or 4-T) pixel cells for convenience of description, the embodiment of the invention is not limited to any particular solid state sensor or any particular pixel cell architecture. For example, the pixel cells could have more or less than four transistors and the invention may be employed in any type of solid state imager device, CCD sensors being but one example.

Figure 1A:
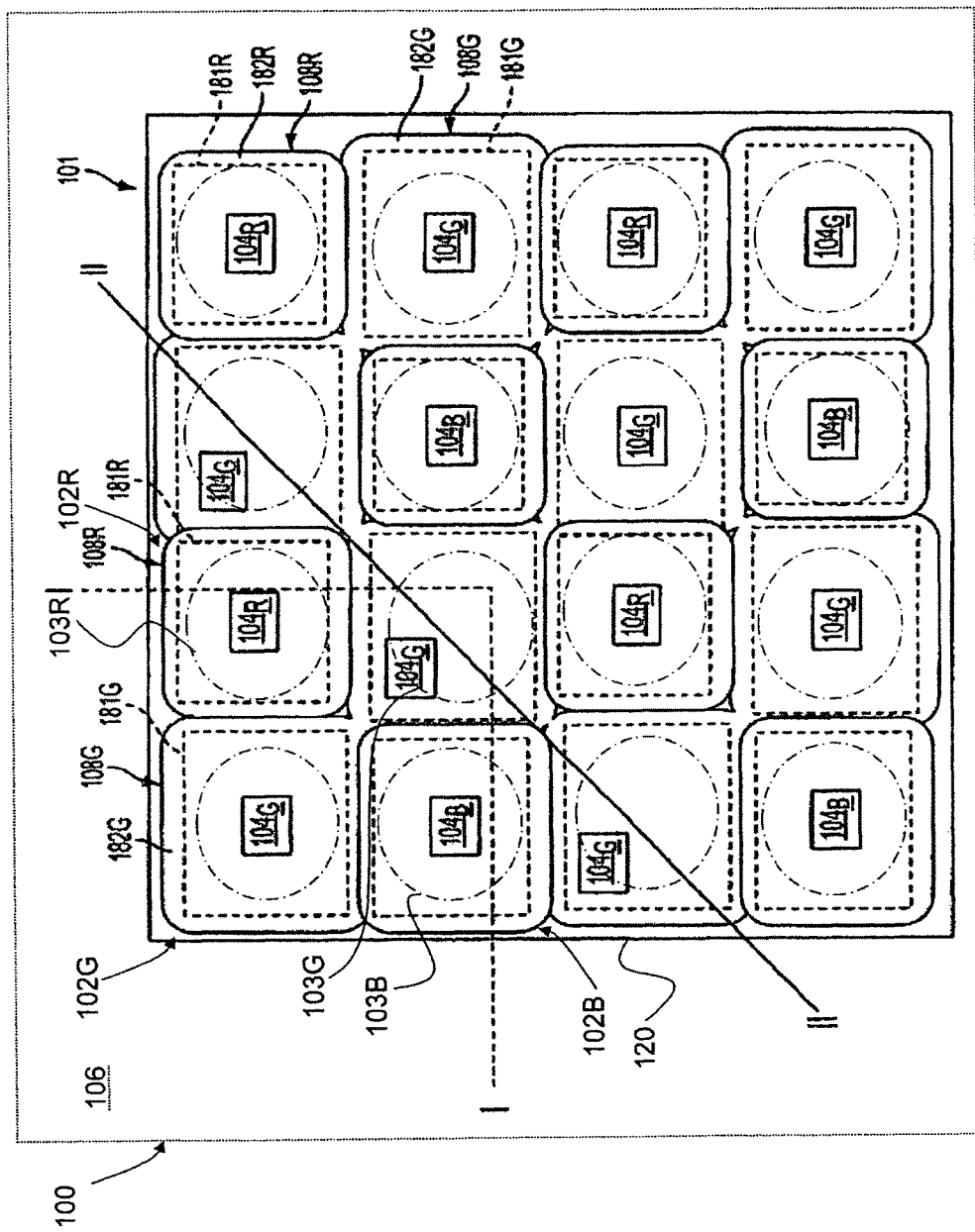
FIGS. 1A-1C illustrate top-down and partial cross-sectional views of an imager device constructed in accordance with an embodiment of the invention.
Figure 1B:
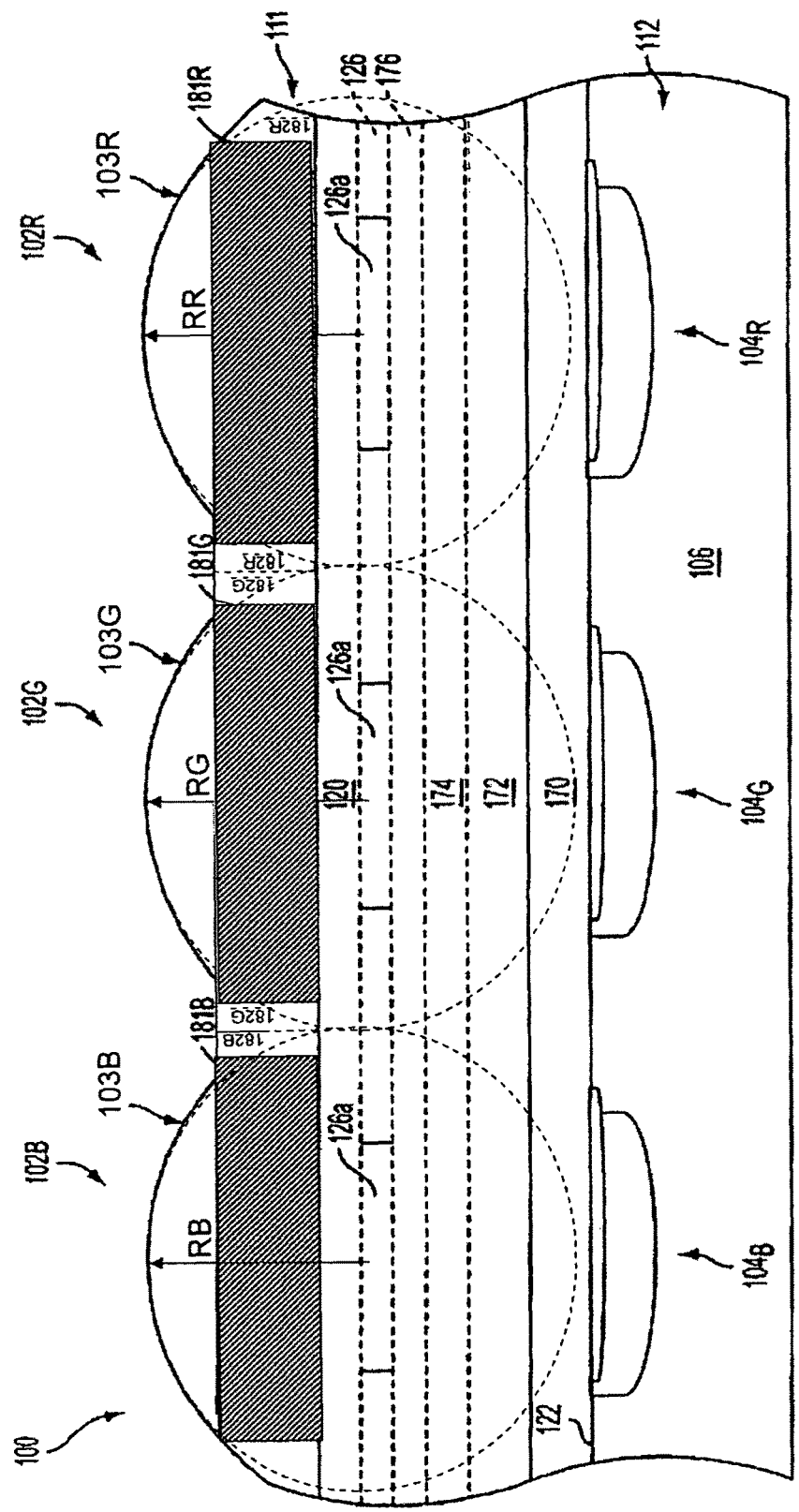
Figure 1C:
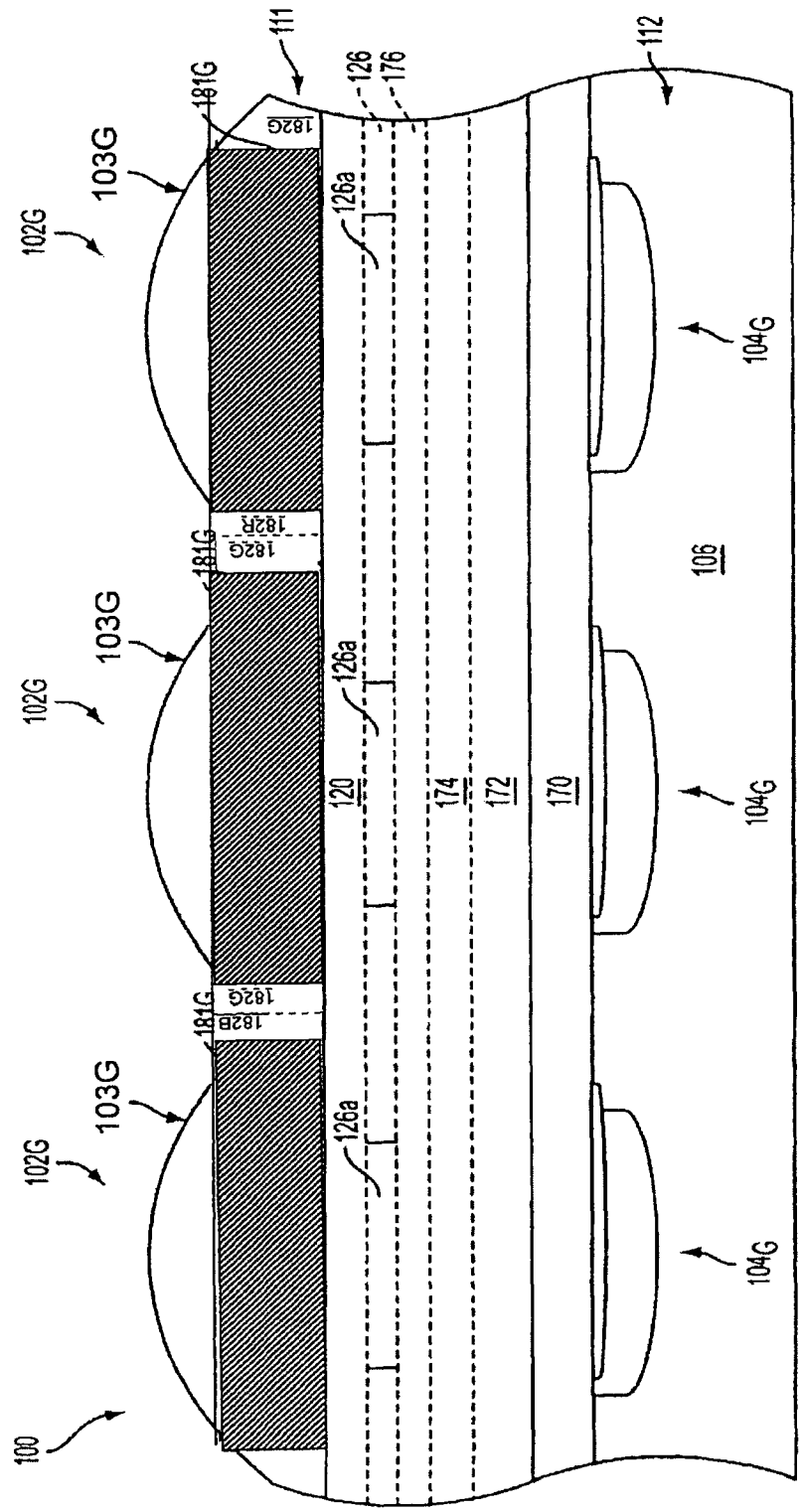

With reference to the figures, where like numerals represent like elements, FIGS. 1A, 1B and 1C, respectively illustrate a partial top-down view, a partial cross-sectional view along the lines I-I of FIG. 1A, and a partial cross-sectional view along the lines II-II of FIG. 1A of a semiconductor-based imager device 100, such as a CMOS imager, constructed in accordance with an embodiment of the invention. The imager device 100 includes a pixel cell array 101 with first, second, and third pixel cells $102_B$, $102_G$, $102_R$, respectively. First, second, and third pixel cells $102_B$, $102_G$, $102_R$ correspond to wavelengths of light associated with the colors blue, green, and red, respectively. Those of ordinary skill in the art will recognize that the illustrated example is not intended to be limiting, and that first, second, and third pixel cells $102_B$, $102_G$, $102_R$ could correspond to wavelengths of light associated with other colors of light; for example, cyan, magenta, and yellow and there may be more or less than three color pixels. It should also be noted that although FIGS. 1A, 1B, and 1C illustrate several pixel cells in the pixel cell array 101, the pixel cell array 101 could contain millions of pixel cells.

FIG. 1A illustrates first, second, and third pixel cells $102_B$, $102_G$, $102_R$ having respective first, second, and third photosensitive regions $104_B$, $104_G$, $104_R$ fabricated on a semiconductor substrate 106. The first, second, and third pixel cells $102_B$, $102_G$, $102_R$ also include respective first, second, and third color filters $108_B$, $108_G$, $108_R$ formed at a higher level of the illustrated pixel cell structure over respective first, second, and third photosensitive regions $104_B$, $104_G$, $104_R$ and over a passivation layer 120. The first, second, and third color filters $108_B$, $108_G$, $108_R$ comprise respective first, second, and base material layers $181_R$, $181_G$, $181_R$ formed in association with respective first, second, and third conforming layers $182_B$, $182_G$, $182_R$ and over the passivation layer 120. The pixel cell array also includes respective first, second, third microlenses $103_B$, $103_G$, $103_R$ formed over the color filters $108_B$, $108_G$, $108_R$.

As illustrated in FIG. 1B, the pixel cell array 101 also includes a light shield 126 having openings 126a in optical alignment with respective photosensitive regions $104_B$, $104_G$, $104_R$, and other conventional layers illustrated as first, second, and third interlayer dielectrics 172, 174, 176, respectively, and an insulating layer 170 over the active electrical elements of the pixel cells $102_B$, $102_G$, $102_R$.

FIG. 1C illustrates a partial cross-sectional view taken along three second pixel cells $102_B$. The second color filters $108_B$ are coextensive with one another (also illustrated in FIG. 1A). The second conforming layers $182_B$ of each of the second color filters $108_B$ are substantially gapless, and collect more light than if the second conforming layers $182_B$ of each of the second color filters $108_B$ were not coextensive.

The imager device 100 of FIGS. 1A, 1B, and 1C has color filters (e.g., first, second, and third color filters $108_B$, $108_G$, $108_R$) that are not contracted relative to a center of the underlying photosensors (e.g., first, second, and third photosensors $104_B$, $104_G$, $104_R$), and have microlenses (e.g., first, second, and third microlenses $103_B$, $103_G$, $103_R$) which are in optical alignment with respective photosensitive regions $104_B$, $104_G$, $104_R$. The formation of the conforming layers (e.g., first, second, and third conforming layers $182_B$, $182_G$, $182_R$) over the base material layers (e.g., first, second, and third base material layers $181_B$, $181_G$, $181_R$) may provide a substantially more planar first, second, and third color filters $108_B$, $108_G$, $108_R$ formed over the semiconductor substrate 106 that conventional processes, discussed above with respect to the Background. Moreover, the microlenses formed thereon (e.g., first, second, and third microlenses $103_B$, $103_G$, $103_R$) may have reduced shifted focal points relative to a center of the underlying photosensitive regions $104_B$, $104_G$, $104_R$. As a result, the imager device 100 may have a substantially reduced amount of cross-talk between pixel cells.

The first, second, and third color filters $108_B$, $108_G$, $108_R$ correspond to a filter allowing first, second, and third wavelengths of light to strike respective photosensitive regions $104_B$, $104_G$, $104_R$. Each of the microlenses $103_B$, $103_G$, $103_R$ has a respective radius of curvatures $R_B$, $R_G$, $R_R$ (FIG. 1B) that may be optimized to direct light of a particular wavelength to different depths within the photosensitive regions.

Additionally, the refractive indexes of the base material layers $181_B$, $181_G$, $181_R$ and the conforming layers $182_B$, $182_G$, $182_R$ are different, but need not be so. For example, the first base material layers $181_B$, $181_G$, $181_R$ and the conforming layers $182_B$, $182_G$, $182_R$ could be different from one another, and selected such that the refractive indexes focus light of a particular wavelength onto the focal plane 122 of the photosensitive regions $104_B$, $104_G$, $104_R$. The illustrated base material layers $181_B$, $181_G$, $181_R$ are greater than the conforming layers $182_B$, $182_G$, $182_R$.

The imager device 100 of FIGS. 1A-1C has color filters that are fabricated in a manner as to decrease the susceptibility of contraction of the color filter array 111, as discussed in greater detail below. The decrease in the contraction of the color filter array 111 results in decreased cross-talk which may be associated with conventional methods of fabricating color filter arrays.

As discussed above with respect to FIG. 1C, adjacent second color filters $108_G$ can be fabricated to be coextensive, reducing the amount of gapping between adjacent color filters. The reduction in gapping improves the amount of light capture, and also decreases the amount of possible cross-talk, or undirected light striking the photosensitive region array 112.

Figure 2A:
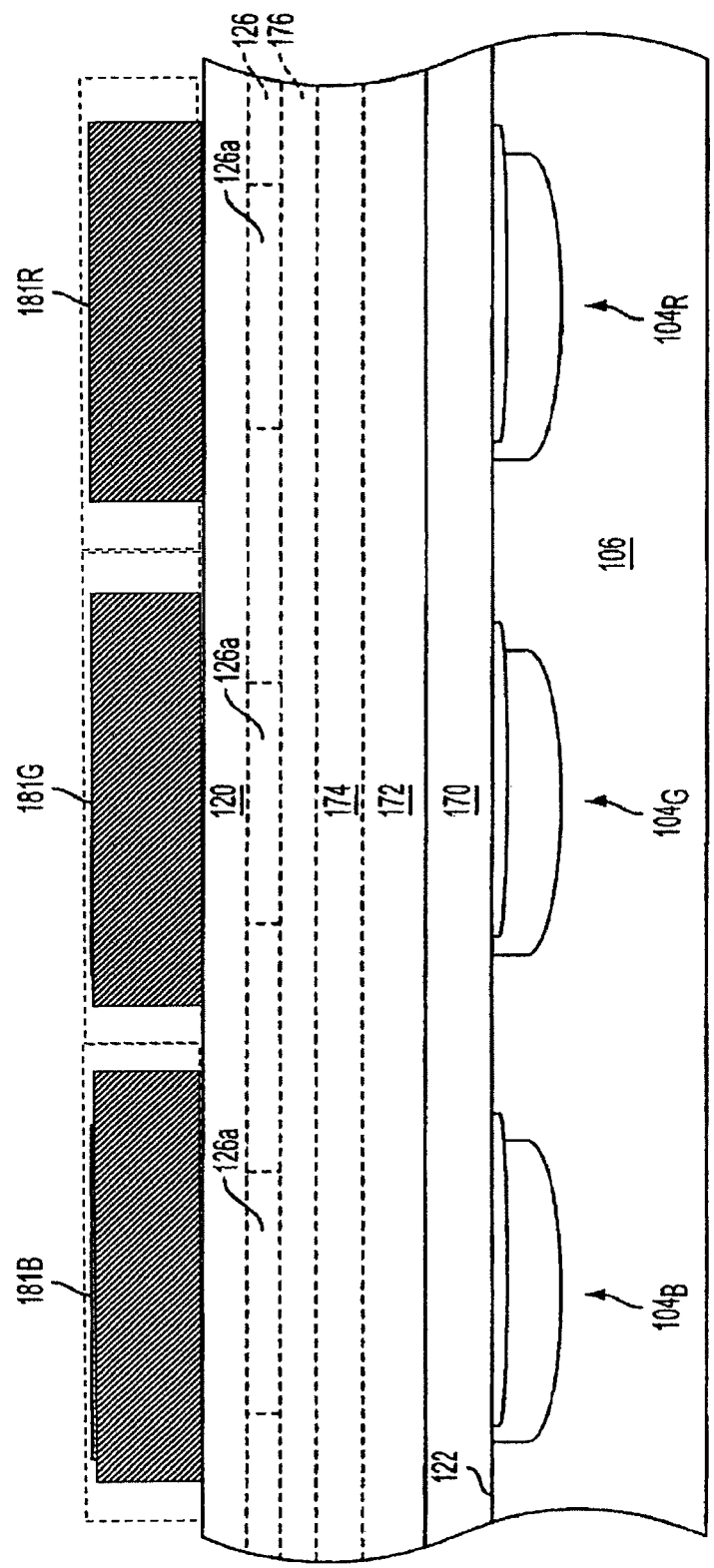
FIGS. 2A-2D illustrate a method of fabricating the imager device illustrated in FIGS. 1A-1B.

FIGS. 2A-2D illustrate a method of fabricating the FIG. 1B imager device 100 taken along line I-I of FIG. 1A. Specifically, FIG. 2A illustrates the patterning of the first, second, and third base material layers $181_B$, $181_G$, $181_R$ over the passivation layer 120 of the imager device 100. The first, second, and third base material layers $181_B$, $181_G$, $181_R$ could be formed of any transparent material including, but not limited to, zinc selenide (ZnSe), silicon oxide, silicon nitride, silicon oxynitride, silicon-carbon (SiC) (BLOk), tantalum pentoxide ($Ta_2O_5$), titanium oxide ($TiO_2$), polymethylmethacrylate, polycarbonate, polyolefin, cellulose acetate butyrate, polystyrene, polyimide, epoxy resin, photosensitive gelatin, acrylate, methacrylate, urethane acrylate, epoxy acrylate, polyester acrylate, or a positive or negative photoresist such as a 3000 series photoresist material (or any other series of photoresist material) produced by FUJIFILM Electronic Materials (FFEM), Japan, including, but not limited to color resists known in the art as SB-3000L, SG-3000L and SR-3000L for blue, green, and red color filters, respectively. It should also be noted that the materials could be selected from a manufacturer other than FUJIFILM, and that the materials could be any color filtering material.

The materials selected should correspond to filtering a particular wavelength of light from striking the photosensitive regions $104_B$, $104_G$, $104_R$. Accordingly, in one embodiment of the invention, the first, second, and third base material layers $181_B$, $181_G$, $181_R$ comprise SB-3000L, SG-3000L and SR-3000L, respectively. The base material layers $181_B$, $181_G$, $181_R$ are deposited over the passivation layer 120 by conventional coating methods, including, but not limited to, spin-coating methods, and selectively patterned over the first, second, and third photosensitive regions $104_B$, $104_G$, $104_R$, respectively.

The base material materials $181_B$, $181_G$, $181_R$ can be selectively patterned by forming base material layer precursors over the photosensitive regions $104_B$, $104_G$, $104_R$, and selectively exposing the base material layer precursors to ultraviolet (UV) light. As known in the art, a negative photoresist is polymerized when exposed to UV light. Accordingly, if negative photoresist materials are used to form the first, second, and third base material layers $181_B$, $181_G$, $181_R$ the base material layer precursors are selectively masked such that only those portions of the base material layer precursors intended to form first, second, and third base material layers $181_B$, $181_G$, $181_R$ are exposed to UV light. Those portions that are unnecessary are not exposed to light, and are removed by a developer solution.

Conversely, a positive photoresist is exposed with UV light wherever the underlying material is to be removed. Accordingly, if positive photoresist materials are used to form first, second, and third base material layers $181_B$, $181_G$, $181_R$, the base material layer precursors are selectively masked such that only those portions of the base material layer precursors that are unnecessary are exposed to light, and are subsequently removed by a developer solution. The unexposed portions of the positive photoresist remain behind to form the first, second, and third base material layers $181_B$, $181_G$, $181_R$.

It should be noted that although FIG. 2A illustrates the deposition and patterning of the first, second, and third base material layers $181_B$, $181_G$, $181_R$ in a single step, one of ordinary skill in the art will recognize that the base material layers $181_B$, $181_G$, $181_R$ are layered over the passivation layer 120 in separate steps. For example, the precursor to the first base material layer $181_B$ could be deposited by conventional coating methods, including, but not limited to, spin-coating methods, over the passivation layer 120, masked, exposed to UV light, and exposed to developer to pattern the first base material layers $181_B$. A precursor to the second base material layer $181_G$ can subsequently be deposited over the passivation layer 120, masked, exposed to UV light, and exposed to developer to pattern the second base material layers $181_G$. Lastly, a precursor to the third base material layer $181_R$ can be deposited over the passivation layer 120, masked, exposed to UV light, and exposed to developer to pattern the third base material layers $181_R$.

Additionally, it should be recognized that the first, second, and third base material layers $181_B$, $181_G$, $181_R$ could all be formed of a material that does not filter any particular wavelength of light associated with a particular color. For example, the first, second, and third base material layers $181_B$, $181_G$, $181_R$ could all be formed of a clear, transparent material, simplifying the processing steps involved in making the first, second, and third base material layers $181_B$, $181_G$, $181_R$ by patterning a single material for all three base material layers.

As illustrated in FIG. 2A, the first, second, and third base material layers $181_B$, $181_G$, $181_R$ contract from their original size during processing, as illustrated by the dashed lines, and discussed above with respect to the Background. Contraction of approximately 10% of the width may occur. Therefore, a base material layer formed over the passivation layer 120 that is 10 microns wide (as measured by a side cross-sectional view) could contract as much as 1 micron (or, as illustrated, 0.5 microns on both sides of the first, second, and third base material layers $181_B$, $181_G$, $181_R$), leaving a gap between the base material layers (e.g., first and second base material layers $181_B$, $181_G$) of approximately 1 micron.

Figure 2B:
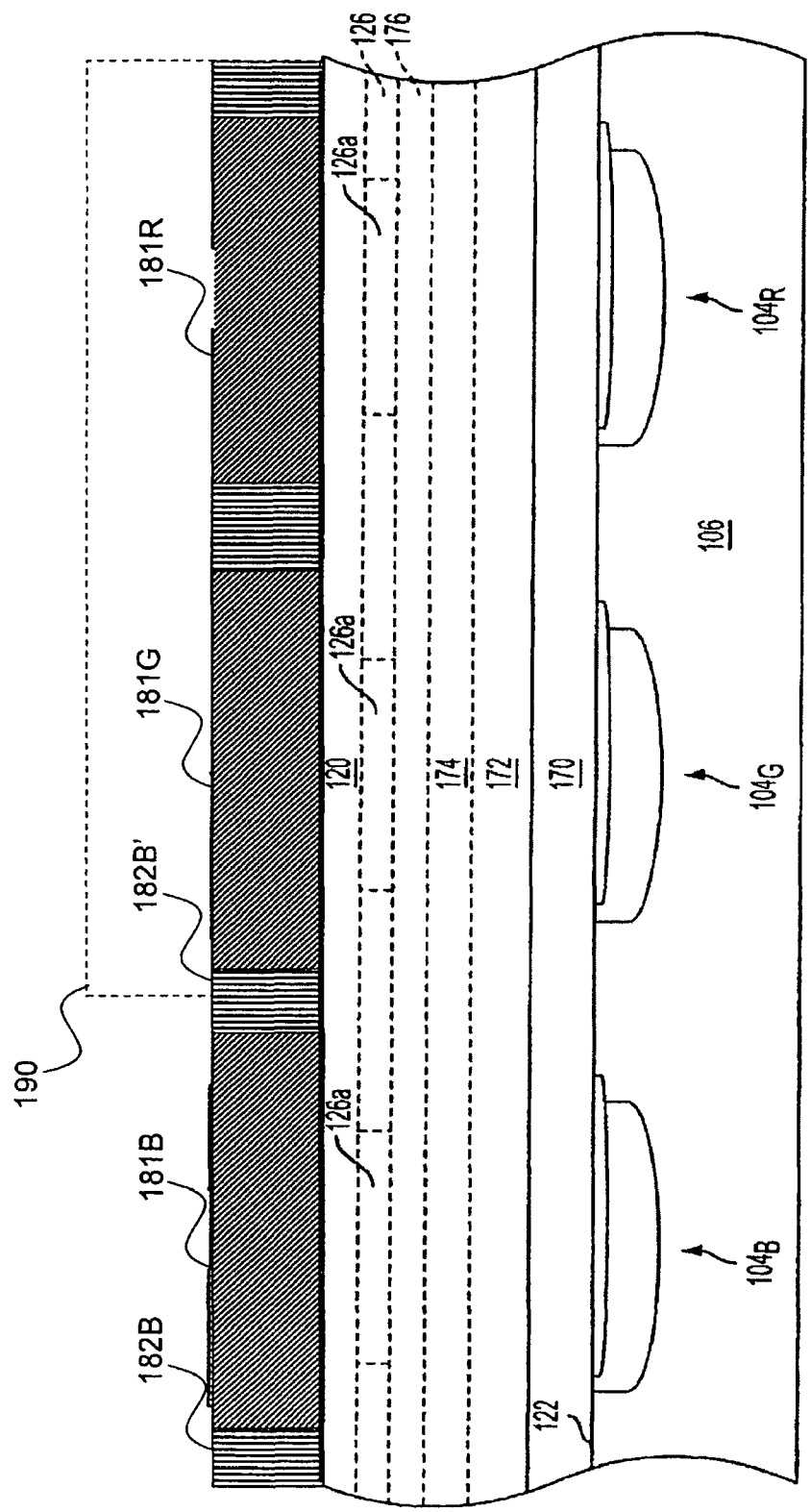

FIG. 2B illustrates the deposition of the first conforming layer $182_B$. The first conforming layer $182_B$ could be formed of any transparent material including, but not limited to, zinc selenide (ZnSe), silicon oxide, silicon nitride, silicon oxynitride, silicon-carbon (SiC) (BLOk), tantalum pentoxide (Ta2O5), titanium oxide (TiO2), polymethylmethacrylate, polycarbonate, polyolefin, cellulose acetate butyrate, polystyrene, polyimide, epoxy resin, photosensitive gelatin, acrylate, methacrylate, urethane acrylate, epoxy acrylate, polyester acrylate, or a positive or negative photoresist such as a material consisting of a 3000 series material fabricated by FUJIFILM Electronic Materials (FFEM), Japan, including, but not limited to color resists such as SB-3000L, SG-3000L and SR-3000L for blue, green, and red color filters, respectively. The illustrated first conforming layer $182_B$ is formed of SB-3000L, the same material used for the underlying base material layer $181_B$.

The illustrated first conforming layer $182_B$ is deposited by conventional methods, including, but not limited to, spin-coating methods. The spin-coating technique provides a simplified fabrication process resulting in a material layer with minimal fabricating costs. During the deposition of the first conforming layer $182_B$, the underlying first base material layer $181_B$ acts as a barrier over which the material forming the first conforming layer $182_B$ must traverse. The first conforming layer $182_B$ conforms to the contours of the uneven surface of the intermediate structure, and flows into the gaps or spaces between the base material layers.

As discussed below, the first conforming layer $182_B$ may have inherent surface tensions that are selected to provide different shapes to any of the first, second, and third conforming layers $182_B$, $182_G$, $182_R$. Different materials have different inherent surface tension properties (measured in dynes/cm); accordingly, the material forming the first conforming layer $182_B$ could be selected for the intended application. For example, a material having a higher surface tension is used for applications in which a more spherical shape than illustrated in FIG. 2B is desired. Conversely, a material having a lower surface tension is used for applications in which a substantially planar surface is desired. The surface tension of the illustrated first conforming layer $182_B$ is low, thereby creating a substantially planar surface.

It should be noted, however, that materials often have varying degrees of surface tension depending on the conditions in which the materials are deposited. For example, materials typically have a greater surface tension at cooler temperatures (e.g., 20° C.) as compared to the surface tension of the material at higher temperatures (e.g., 70° C.). Therefore, the conditions at which the first conforming layer $182_B$ is deposited can be varied to shape the resulting first color filter $108_B$ (FIG. 1B).

FIG. 2B also illustrates a mask 190 formed over portions of the first conforming layer $182_B'$, which is formed of a negative photoresist. The entire FIG. 2B structure is then exposed to UV light to polymerize the exposed first conforming layer $182_B$. The mask 190 is removed, and the portions of the first conforming layer $182_B'$ that were not polymerized are dissolved by a developer solution, leaving behind only the first conforming layer $182_B$ over the first photosensitive region $104_B$. As illustrated, the first, second, and third base material layers $181_B$, $181_G$, $181_R$ are substantially immune from further contraction; as illustrated in FIG. 2C, however, the first conforming layer $182_B$ does contract during processing.

Figure 2C:
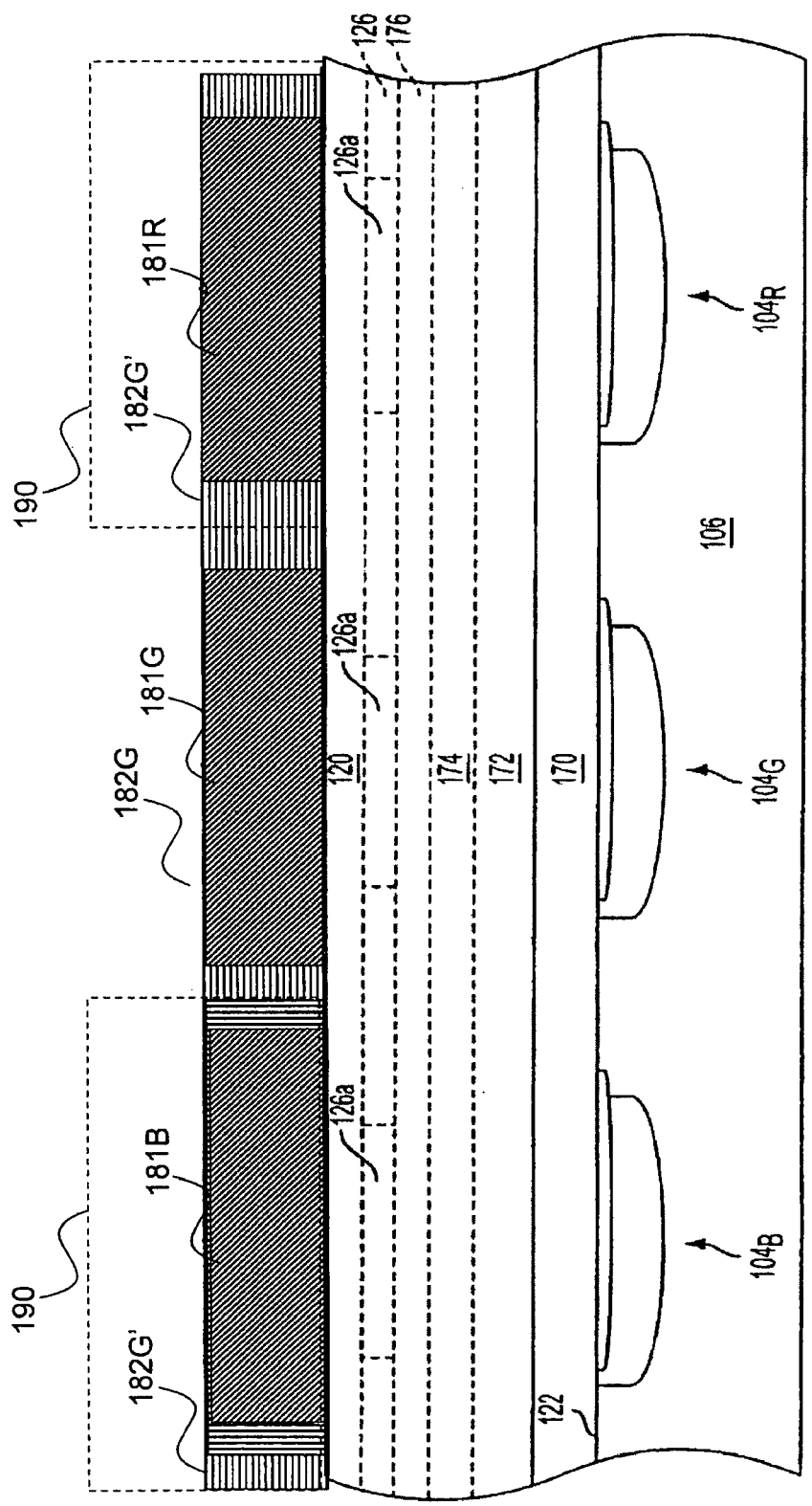

FIG. 2C illustrates the deposition of the second conforming layer $182_G$. The second conforming layer 182 could be formed of any transparent material including, but not limited to, zinc selenide (ZnSe), silicon oxide, silicon nitride, silicon oxynitride, silicon-carbon (SiC) (BLOk), tantalum pentoxide ($Ta_2O_5$), titanium oxide ($TiO_2$), polymethylmethacrylate, polycarbonate, polyolefin, cellulose acetate butyrate, polystyrene, polyimide, epoxy resin, photosensitive gelatin, acrylate, methacrylate, urethane acrylate, epoxy acrylate, polyester acrylate, or a positive or negative photoresist such as a material consisting of a 3000 series material fabricated by FUJIFILM Electronic Materials (FFEM), Japan, including, but not limited to color resists such as SB-3000L, SG-3000L and SR-3000L for blue, green, and red color filters, respectively. The illustrated conforming layer $182_G$ is formed of SG-3000L, the same material used for the underlying base material layer $181_G$.

The illustrated second conforming layer $182_G$ is deposited by conventional coating methods, including, but not limited to, spin-coating methods, as discussed above with respect to FIG. 2B. During the deposition of the second conforming layer $182_G$, the underlying second base material layer $181_G$ acts as a barrier over which the material forming the second conforming layer $182_G$ must traverse, as discussed above with respect to FIG. 2B. The second conforming layer $182_G$ fills the gaps between the color filters (e.g., first, second, and third color filters $108_B$, $108_G$, $108_R$ of FIG. 1B). Like the second conforming layer $182_B$, the second conforming layer $182_G$ can be selected or deposited in conditions to have a predetermined surface tension.

Masks 190 are selectively placed over the first conforming layer $182_B$ and the third base material layer $182_R$. The entire FIG. 2C structure is subsequently exposed to UV light, which polymerizes the second conforming layer $182_G$. The masks 190 are removed, and portions of the second conforming layer $182_G'$ are subjected to developer and removed.

Figure 2D:
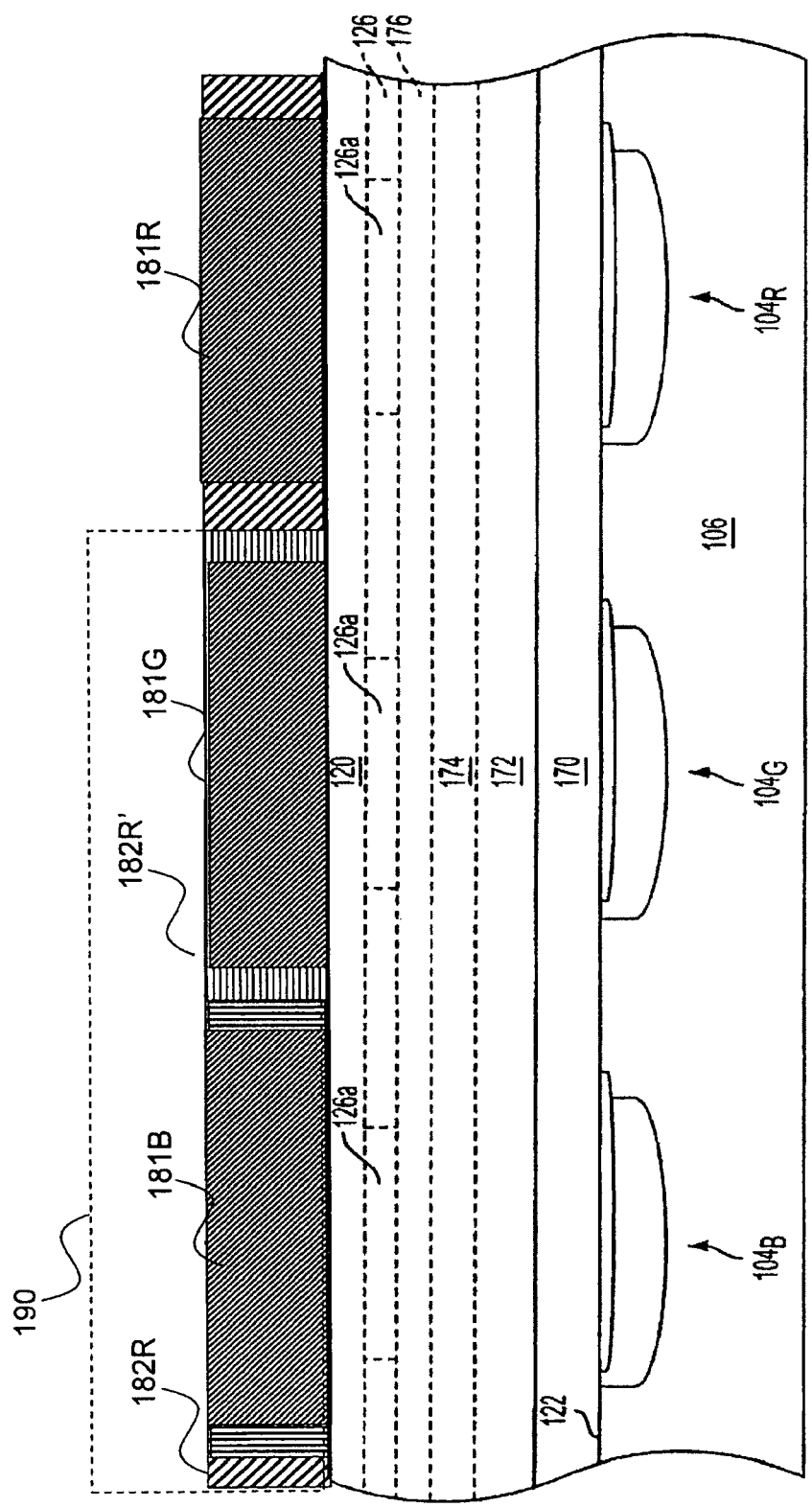

FIG. 2D illustrates the deposition of the third conforming layer $182c$. The third conforming layer $182c$ could be formed of any transparent material including, but not limited to, zinc selenide (ZnSe), silicon oxide, silicon nitride, silicon oxynitride, silicon-carbon (SiC) (BLOk), tantalum pentoxide ($Ta_2O_5$), titanium oxide ($TiO_2$), polymethylmethacrylate, polycarbonate, polyolefin, cellulose acetate butyrate, polystyrene, polyimide, epoxy resin, photosensitive gelatin, acrylate, methacrylate, urethane acrylate, epoxy acrylate, polyester acrylate, or a positive or negative photoresist such as a material consisting of a 3000 series material fabricated by FUJIFILM Electronic Materials (FFEM), Japan, including, but not limited to color resists such as SB-3000L, SG-3000L and SR-3000L for blue, green, and red color filters, respectively. The illustrated conforming layer $182_R$ is formed of SR-3000L, the same material used for the underlying base material layer $181_R$.

The illustrated third conforming layer $182_R$ is deposited by conventional coating methods, including, but not limited to, spin-coating methods, as discussed above with respect to FIG. 2B. During the deposition of the third conforming layer $182_R$, the underlying third base material layer $181_R$ acts as a barrier over which the material forming the third conforming layer $182_R$ must traverse, as discussed above with respect to FIG. 2B. The third conforming layer $182_R$ fills the gaps between the color filters (e.g., first, second, and third color filters $108_B$, $108_G$, $108_R$ of FIG. 1B). Like the second conforming layer $182_B$, the third conforming layer $182_R$ can be selected or deposited in conditions to have a predetermined surface tension.

A mask 190 is selectively placed over the first and second conforming layers $182_B$, $182_G$. The entire FIG. 2D structure is subsequently exposed to UV light, which polymerizes the third conforming layer $182_R$. The mask 190 is removed, and portions of the second conforming layer $182_R'$ are subjected to developer and removed. Microlens precursor blocks are patterned and reflowed over the microlens array 111 (FIG. 1B), resulting in the imager 100 illustrated in FIGS. 1A-1C.

Unlike conventional processing techniques, the illustrated method of fabrication provides for a substantially gapless color filter array without a high incidence of problems associated with the shifting of focal points of overlying microlenses. The reduction of the shifting focal lengths problem improves the overall quantum efficiency. Additionally, the first and second material layers can be deposited onto asymmetrically formed photosensitive regions, as discussed below with respect to FIGS. 8-10B.

It should also be noted that although the conforming layers $182_B$, $182_G$, $182_R$ are illustrated as filtering a corresponding wavelength of light from striking the photosensitive regions $104_B$, $104_G$, $104_R$, the embodiment of the invention is not so limited. For example, the conforming layers $182_B$, $182_G$, $182_R$ could all be formed of the same material, and the filtering of corresponding wavelengths of light could be performed by the underlying base material layers $181_B$, $181_G$, $181_R$. The base material layers $181_B$, $181_G$, $181_R$ are patterned in successive patterning steps such that first, second, and third wavelengths of light are filtered by the base material layers $181_B$, $181_G$, $181_R$, and strike the intended photosensitive regions $104_B$, $104_G$, $104_R$.

Although FIGS. 2A-2D are illustrated as having the conforming layers $182_B$, $182_G$, $182_R$ formed between the base material layers $181_B$, $181_G$, $181_R$, it should be recognized that the conforming layers $182_B$, $182_G$, $182_R$ could be between and over the base material layers $181_B$, $181_G$, $181_R$, as illustrated below with respect to FIG. 4.

Figure 3:
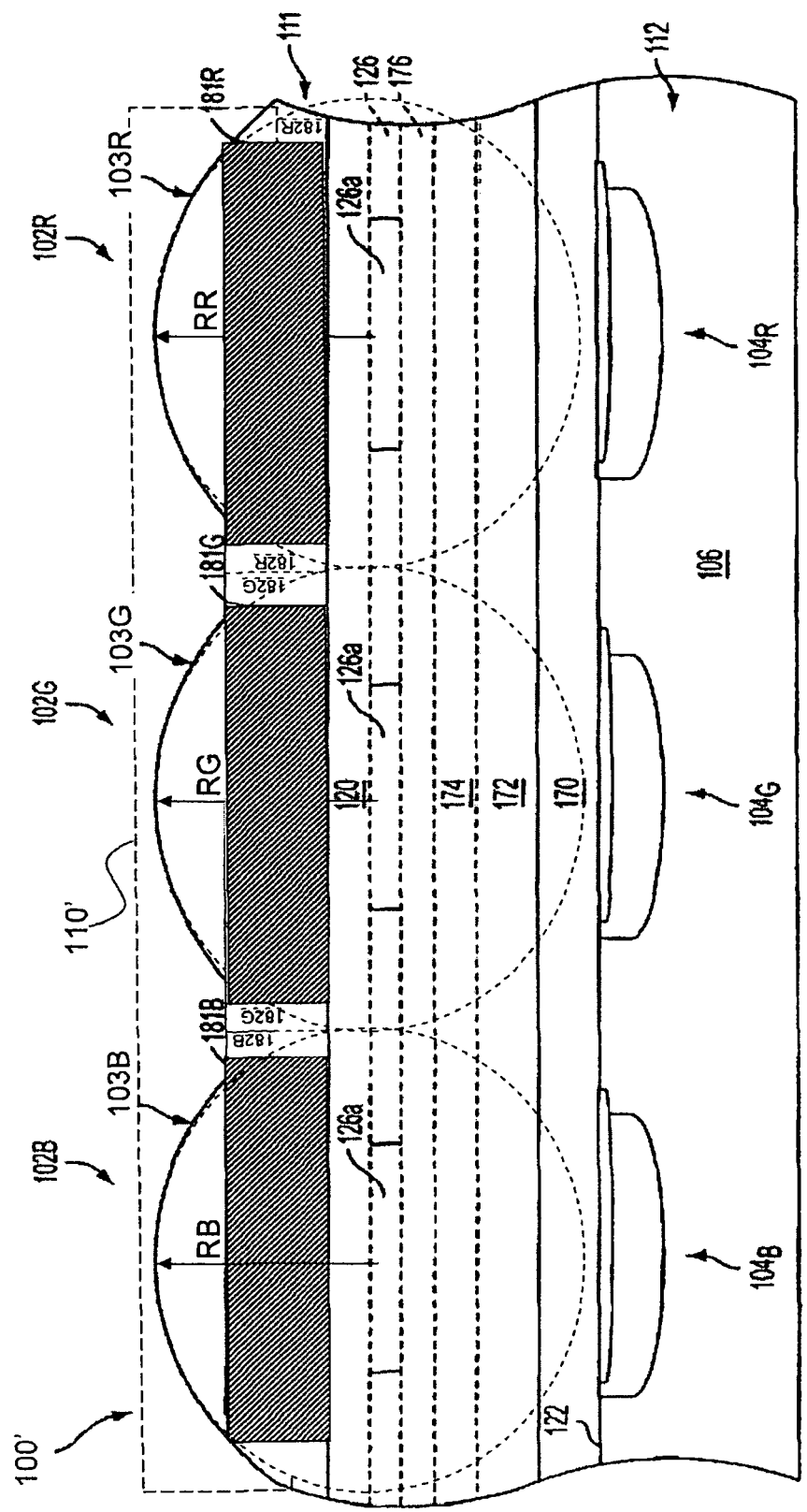
FIG. 3 illustrates a partial cross-sectional view of an imager device constructed in accordance with a second embodiment of the invention

Additional material layers could be formed over the FIG. 1A imager device 100. For example, as illustrated in FIG. 3, a coating 110' could be formed over the FIG. 1A imager device 100 to arrive at the FIG. 3 imager device 100'. The coating 110' is illustrated as being substantially planar, which may provide for better handling throughout subsequent manufacturing processes and additional rigidity to the overall imager device 100'. The substantially planar coating 110' could be formed by conventional coating methods, including, but not limited to, spin-coating methods, as discussed above. The coating 110' could be formed of any of the materials discussed above with respect to FIG. 2A.

Figure 4:
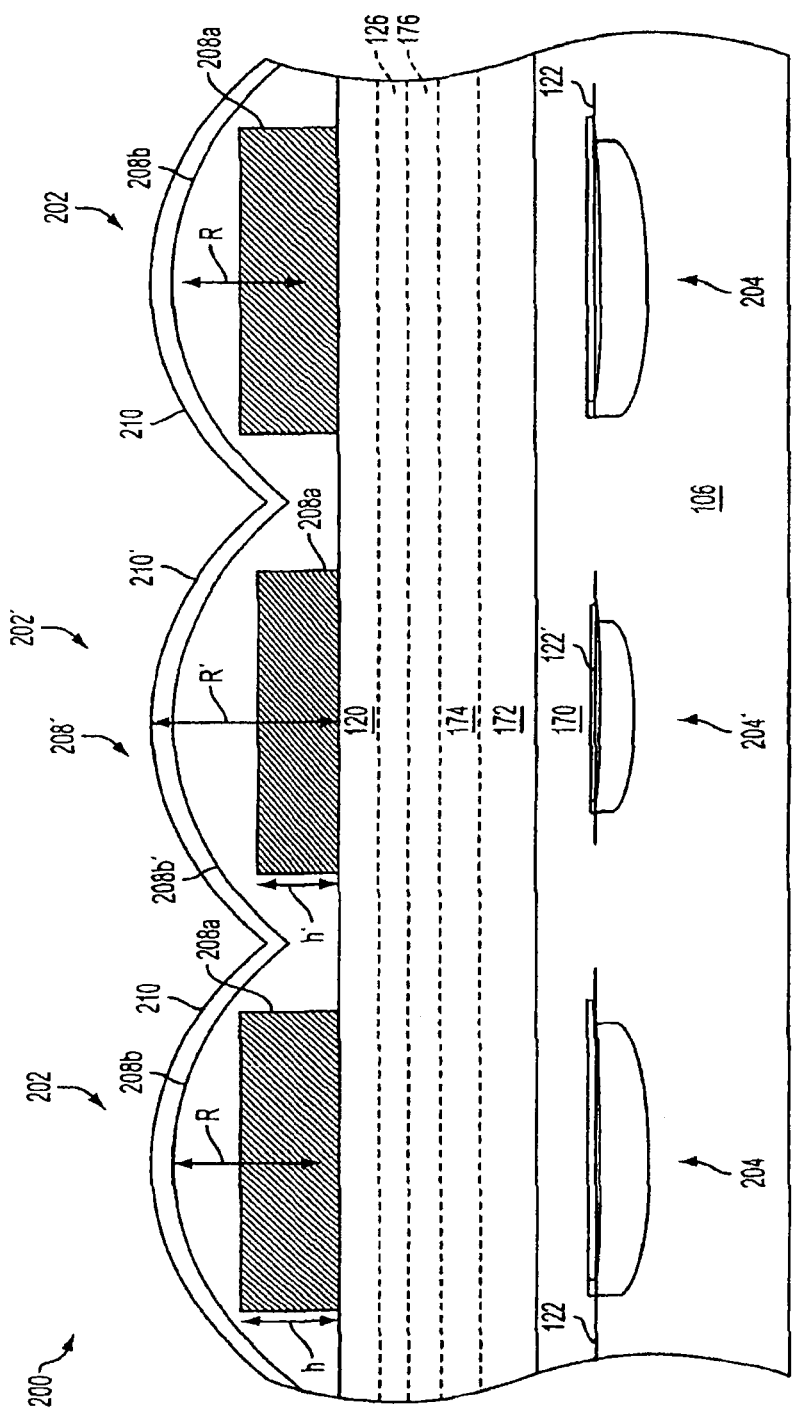
FIG. 4 illustrates a partial cross-sectional view of an imager device constructed in accordance with a third embodiment of the invention.

FIG. 4 illustrates a cross-sectional view of an imager device 200 constructed in accordance with a third embodiment of the invention. Like the imager device 100 illustrated in FIGS. 1A-1C, the FIG. 4 imager device 200 has an array of first, second, and third pixel cells 202, 202', 202, respectively. At least one of the pixel cells (i.e., pixel cell 202') is different from the other two pixel cells (i.e., pixel cells 202) in the array. As discussed above with respect to FIGS. 2A-2D, the materials forming the conforming layers 208b, 208b', 208b are selected (based on their respective surface tensions) or deposited in conditions such that they form rounded structures over the underlying base material layers 208a, 208a', 208a.

The illustrated imager device 200 has a second pixel cell 202' having a different radius of curvature R' from the radius of curvatures R of the adjacent first and third pixel cells 202. In the embodiment, the first and third pixel cells 202 correspond to a first wavelength of light, and the second pixel cell 202' corresponds to a second wavelength of light, which is different from the first wavelength of light.

FIG. 4 illustrates the second pixel cell 202' having a color filter 208' that has a base material layer 208a' formed below a conforming layer 208b'. The first and third pixel cells 202 also have color filters 208 comprised of base material layers 208a formed below conforming layers 208b.

The base material layer 208a' has a height h' that is different from the heights h associated with adjacent base material layers 208a such that the conforming layer 208b' comprises a different volume when compared to the adjacent conforming layers 208b. The smaller volume of the conforming layer 208b' reduces the overall radius of curvature R' of the color filter 208' as compared to adjacent color filters 208. By varying the underlying size (one or more of height, weight, length) of base material layers (e.g., base material layers 208a, 208a'), the volume of the overlying conforming layer (e.g., conforming layer 208b, 208b') can be varied. By varying the volume of the conforming layer 208b, 208b', the overall radius of curvatures (e.g., radius of curvatures R, R') can also be varied, which may result in varied (or asymmetrical) focal lengths 122, 122'.

The ability to vary the focal lengths (e.g., focal lengths 122, 122') of the overall color filters 208, and, to an extent necessary, the focal lengths of optional overlying coating 210, 210', is important in image capture. As is known in the art, light at different wavelengths is absorbed at different depths within a photosensitive region; wavelengths corresponding to blue are typically absorbed near the top surfaces of photosensitive regions (e.g., photosensitive region 204), wavelengths corresponding to red are typically absorbed at or near the p-n junctions of photosensitive regions, and wavelengths corresponding to green are typically absorbed between the top surfaces and p-n junctions of photosensitive regions.

FIG. 4 illustrates pixel cells 202, 202' that have focal lengths 122, 122' that are optimized for the absorption of wavelengths corresponding to the colors red and green, respectively. The imager device 200 has color filters 208, 208' that have radius of curvatures R, R', respectively, that are designed to focus light onto respective photosensitive regions 204, 204'.

The FIG. 4 imager device 200 is fabricated in substantially the same manner as the imager device 100 illustrated in FIGS. 1A and 1B; at least one of the base material layers (e.g., base material layer 208a') is typically planarized to a lower height h' than adjacent base material layers (e.g., first material layers 208a) having a greater height h. The second material layers 208b, 208b' are subsequently formed over the base material layers 208a, 208a' to form the overall color filter 208. The optional coating 210, 210' can be formed over the color filters 208, 208', if desired.

Figure 5A:
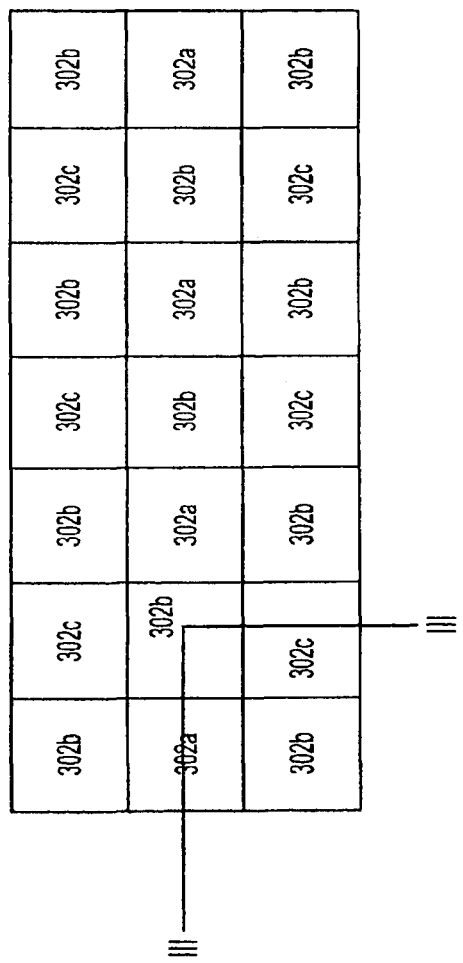
FIGS. 5A-5B illustrate partial top-down and cross-sectional views of an imager device constructed in accordance with a fourth embodiment of the invention.
Figure 5B:
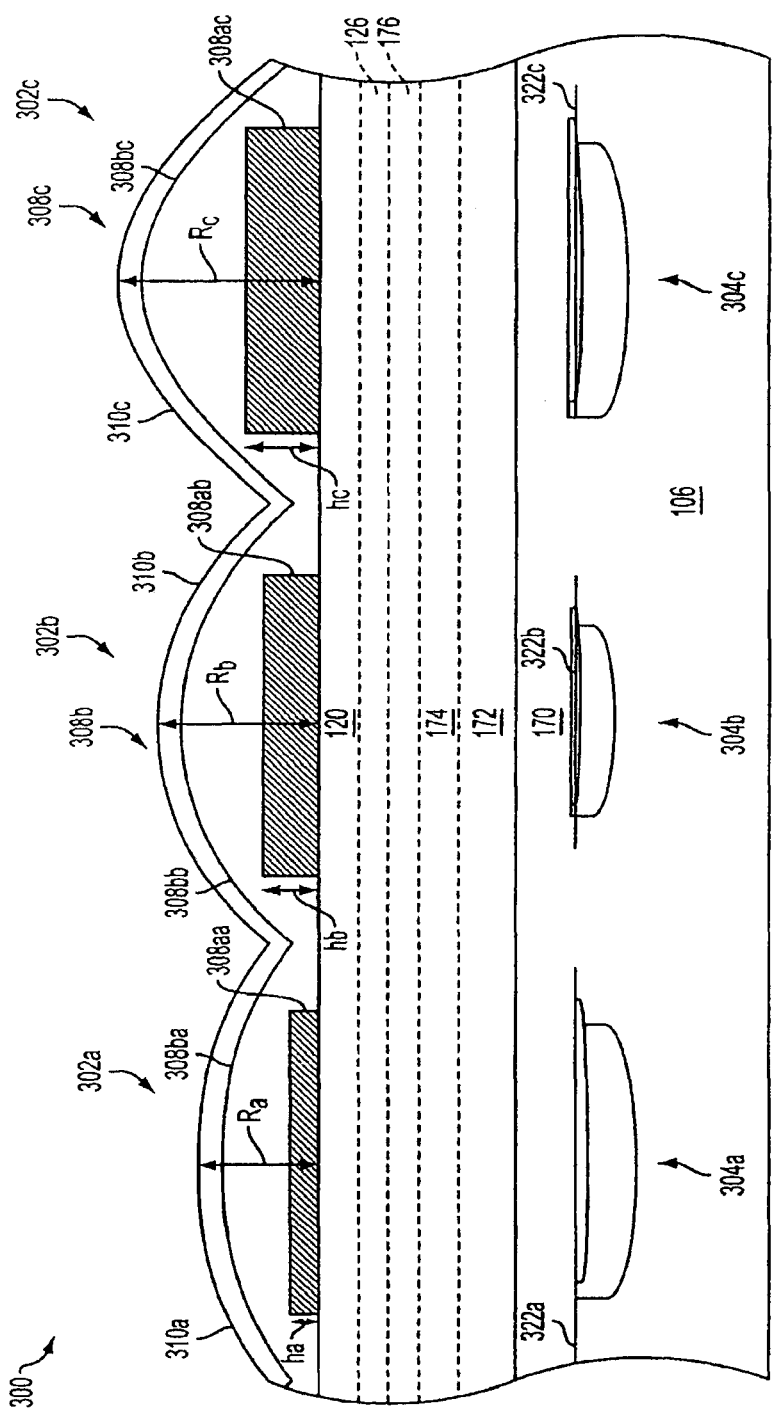

FIGS. 5A and 5B illustrate top-down and cross-sectional view, respectively, of an imager device 300 constructed in accordance with a fourth embodiment of the invention. FIG. 5A illustrates a Bayer pattern comprising first, second, and third pixel cells 302a, 302b, 302c. As illustrated in FIG. 5B, a cross-sectional view taken along line of FIG. 5A, the first pixel cell 302a has a first color filter 308a having a first base material layer 308aa formed below a first conforming layer 308ba. An optional first coating 310a is illustrated as being formed over the first color filter 308a. The first base material layer 302aa of the first color filter 308a has a height ha, which results in the first color filter 308a and the overlying first coating 310a having a first radius of curvature Ra. The first radius of curvature Ra is illustrated as being shorter in comparison to adjacent second and third radius of curvatures Rb, Rc, respectively. The first radius of curvature Ra directs light onto a first focal plane 322a. The first focal length coincides with the absorption depth of wavelengths of light corresponding to the color blue in a first photosensitive region 304b, as discussed above with respect to FIG. 4.

The second pixel cell 302b has a second color filter 308b having a second base material layer 308ab formed below a second conforming layer 308bb. An optional second coating 310b is formed over the second color filter 308b of the imaging device 300. The illustrated second base material layer 308ab has a second height hb, which effects the overlying curvature of the second color filter 308b and the second coating 310b resulting in a second radius of curvature Rb. The radius of curvature Rb is such that the second color filter 308b and the second coating 310b direct light onto a second focal length 322b; the second focal length 322b coincides with the absorption depth of wavelengths of light corresponding to the color green in a second photosensitive region 304g, as discussed above with respect to FIG. 4.

Similarly, the third pixel cell 302c has a third color filter 308c having a third base material layer 308ac formed below a third conforming layer 308bc. An optional third coating 310c is formed over the third color filter 308c of the imaging device 300. The illustrated third base material layer 308ac has a third height hc, which effects the overlying curvature of the third color filter 308c and the third coating 310c resulting in a third radius of curvature Rc. The radius of curvature Rc is such that the third color filter 308c and the third coating 310c direct light onto a third focal length 322c; the third focal length 322c coincides with the absorption depth of wavelengths of light corresponding to the color red in a third photosensitive region 304r, as discussed above with respect to FIG. 4.

The imager device 300 of FIGS. 5A and 5B is fabricated in substantially the same manner as the imager device 100 of FIGS. 1A and 1B (illustrated in FIGS. 2A-2E); however, the first base material layer 308aa is formed prior to the second and third base material layers such that the first base material layer 308aa can be planarized to a height ha prior to the deposition of the second and third base material layers 308ab, 308ac. Similarly, the second base material layer 308ab is formed prior to the third base material layer 308ac, such that the second base material layer 308ab can be planarized to a height hb prior to the deposition of the third base material layer 308ac. The first, second, and third conforming layers 308ba, 308bb, 308bc are subsequently formed over respective first, second, and third base material layers 308aa, 308ab, 308ac to form the overall first, second, and third color filters 308a, 308b, 308c. The optional coating 310a, 310b, 310c can be formed over the color filters 308a, 308b, 308c, if desired.

Figure 6:
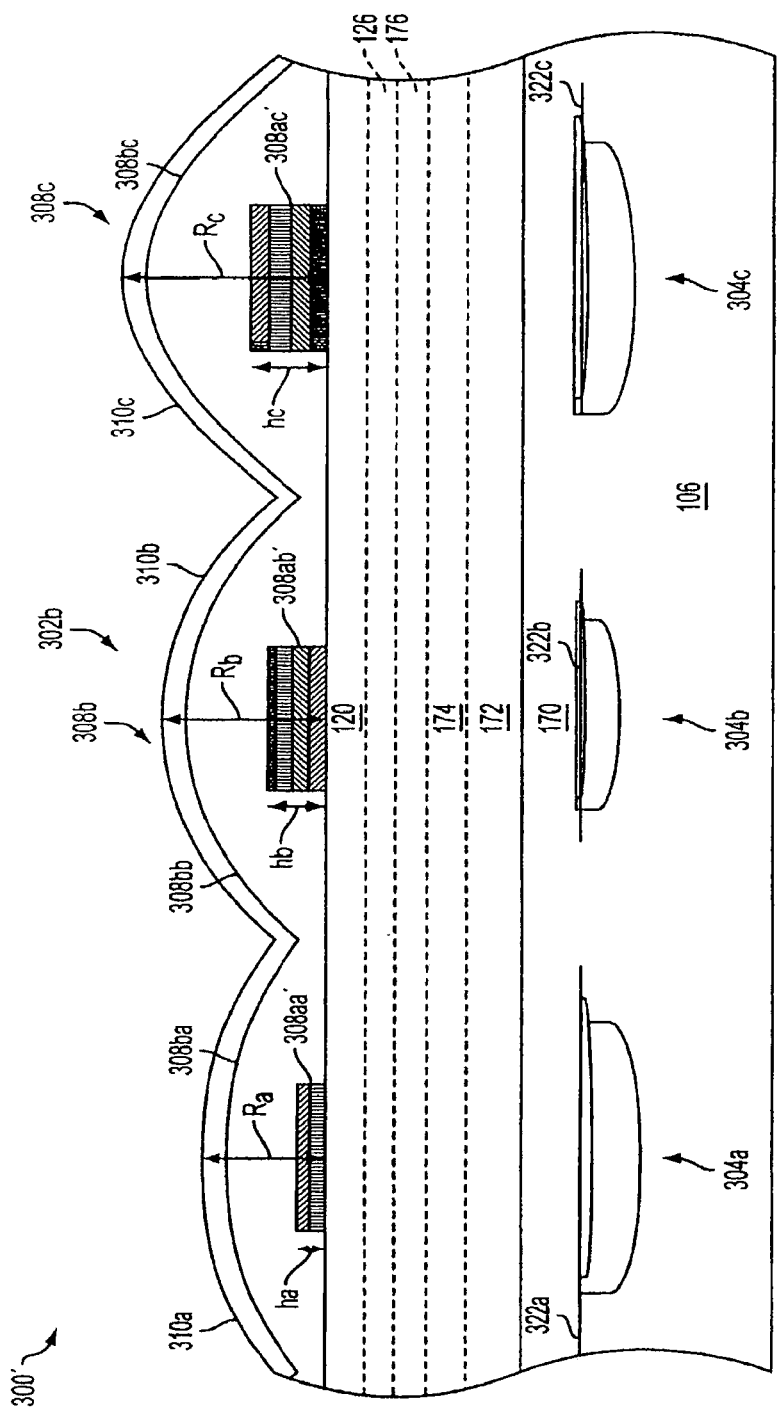
FIG. 6 illustrates a partial cross-sectional view of an imager device constructed in accordance with a fifth embodiment of the invention.

FIG. 6 illustrates an imager device 300' constructed in accordance with a fifth embodiment of the invention. The illustrated cross-sectional view of the imager device 300' is taken along line of FIG. 5A. The imager device 300' is similar to the FIG. 5 imager device 300; however, the imager device 300' has first, second, and third base material layers 308aa', 308ab', 308ac' comprised of multiple material layers (or stacks). The first, second, and third base material layers 308aa', 308ab', 308ac' are formed by depositing multiple material layers over the passivation layer 120. The multiple material layers may be deposited by any deposition technique; for example, spin-coat deposition. The multiple layers are subsequently selectively etched and selectively planarized to form first, second, and third base material layers 308aa', 308ab', 308ac' having different heights ha, hb, hc, respectively. The first, second, and third conforming layers 308ba, 308bb, 308bc are formed over the first, second, and third base material layers 308aa', 308ab', 308ac' resulting in first, second, and third color filters 308a, 308b, 308c with first, second, and third radius of curvatures Ra, Rb, Rc, respectively.

Figure 7:
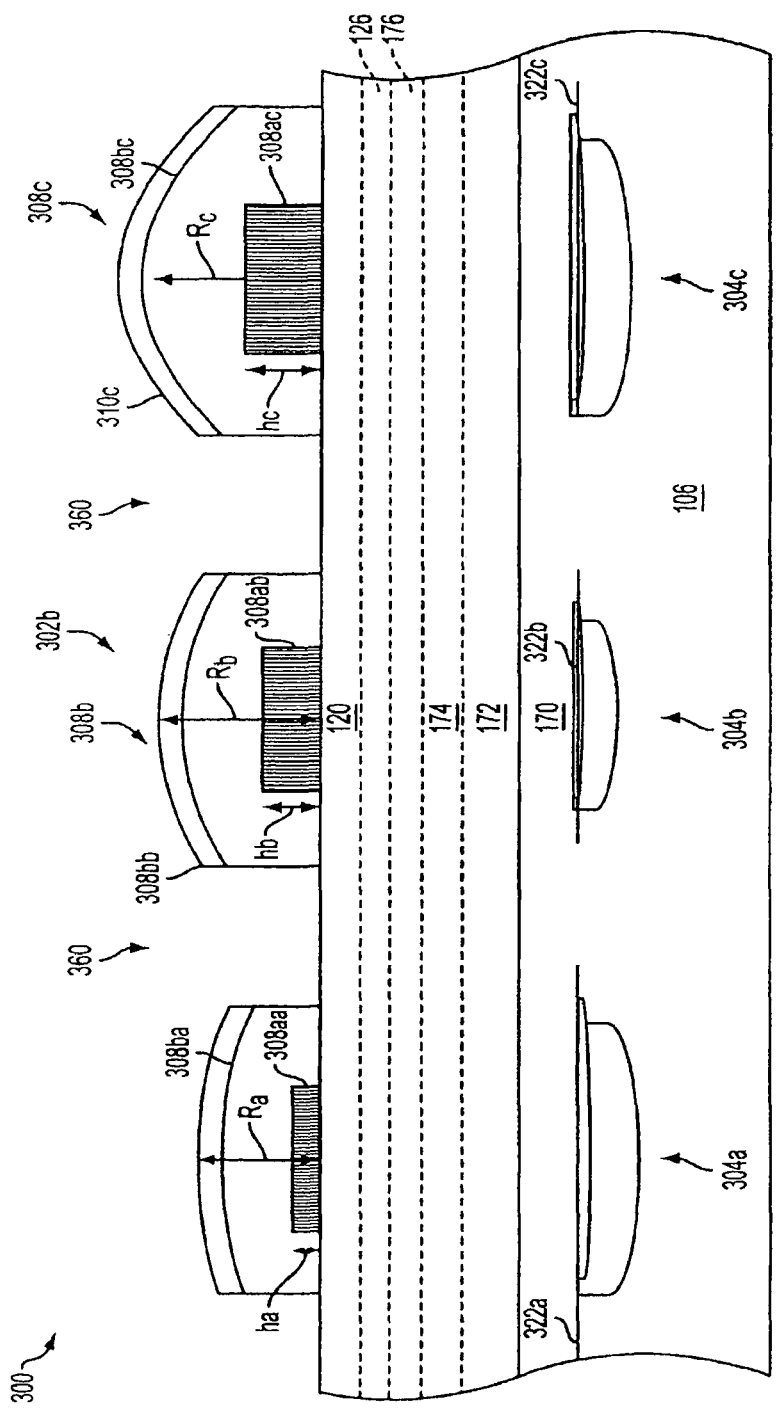
FIG. 7 illustrates a partial cross-sectional view of an imager device constructed in accordance with a sixth embodiment of the invention.

FIG. 7 illustrates further optional processing of the FIG. 5 imager device 300. Specifically the first, second, and third color filters 308a, 308b, 308c and the first, second, and third coating 310a, 310b, 310c are selectively etched to create vias 360 in between the first, second, and third pixel cells 302a, 302b, 302c. Creating vias 360 may reduce the amount of cross-talk between pixel cells (e.g., first, second, and third pixel cells 302a, 302b, 302c). "Cross-talk" results when off-axis wavelengths of light strike a coating or color filter at an obtuse angle of incidence. The off-axis wavelengths of light pass through material layers and miss the intended photosensitive regions, and instead strike adjacent photosensitive regions. Creating the vias 360 isolate the first, second, and third pixel cells 302a, 302b, 302c from one another such that the incidence of cross-talk may decrease.

FIG. 8 illustrates further optional processing of the FIG. 7 imager device 300. To further reduce the incidence of cross-talk, spacer structures 362 made of an opaque material may be formed within the vias 360 (FIG. 6). The spacer structures 362 can be formed by conventional deposition techniques. The spacer structure 362 limit wavelengths of light from striking the first, second, and third photosensitive regions 304b, 304g, 304r of the first second and third pixel cells 302a, 302b, 302c.

It should be noted that the FIG. 5 imager device need not be further processed, and that the illustrations and descriptions relating to FIGS. 7-8 are only optional. Additionally, it should be noted that the imager device 300 of FIGS. 5-8 may undergo further processing, and that the illustrations and descriptions thereto are only examples.

Figure 9A:
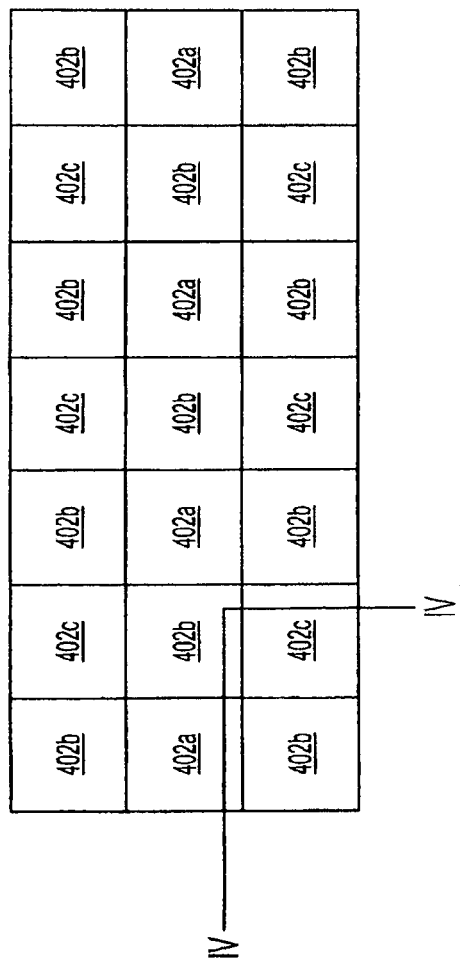
FIGS. 9A-9B illustrate partial top-down and partial cross-sectional views, respectively, of an imager device constructed in accordance with a eighth embodiment of the invention.
Figure 9B:
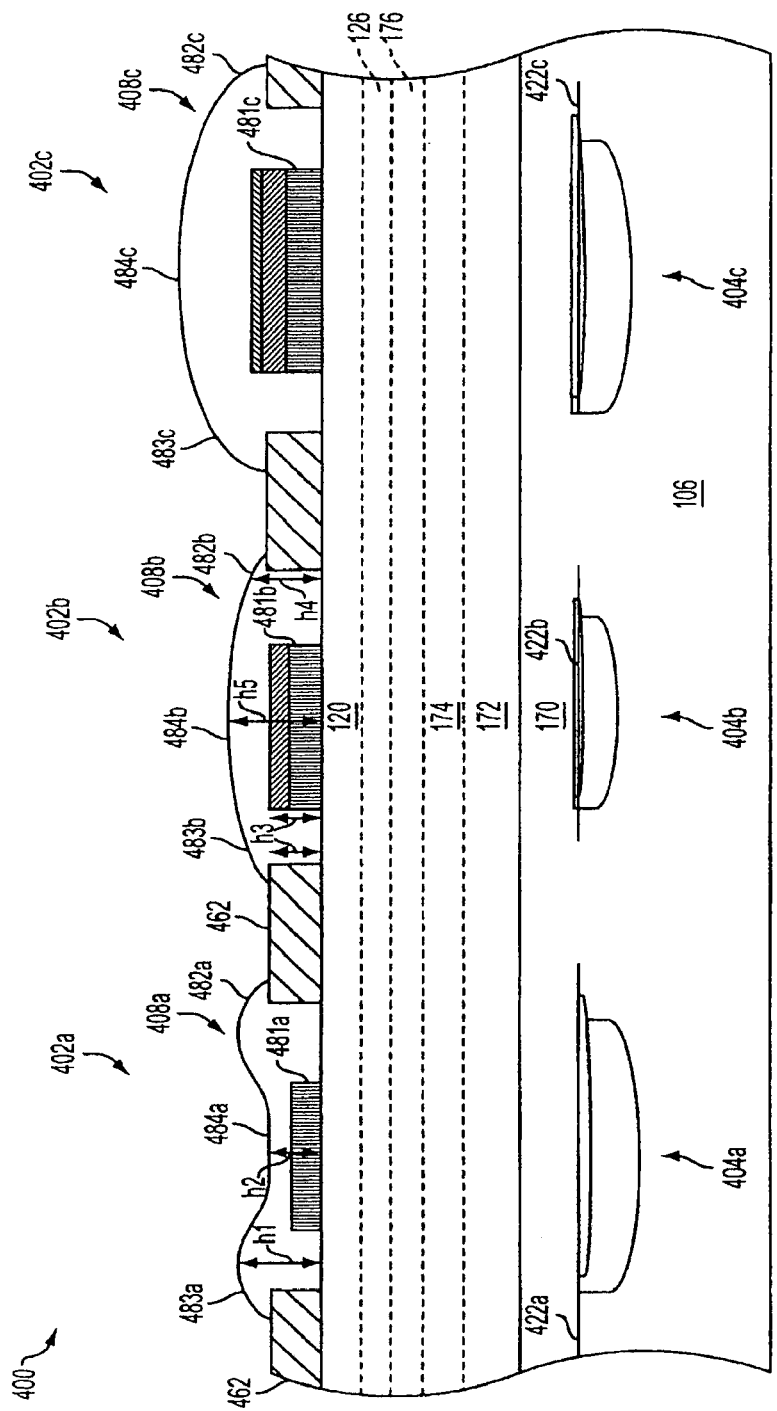

FIGS. 9A and 9B illustrate top-down and cross-sectional views, respectively, of an imager device 400 constructed in accordance with an eighth embodiment of the invention. FIG. 9A illustrates a Bayer pattern comprising first, second, and third pixel cells 402a, 402b, 402c. As illustrated in FIG. 9B, a cross-sectional view taken along line IV-IV of FIG. 9A, The imager device 400 is similar to the FIG. 8 imager device 300; however, the processing steps performed to form the FIG. 9 imager device 400 are different, resulting in structural differences between the two imager devices.

As illustrated, the imager device 400 has first, second and third pixel cells 402a, 402b, 402c having respective first second and third color filters 408a, 408b, 408c. The first second and third color filters 408a, 408b, 408c have respective first, second, and third base material stacks 481a, 481b, 481c, formed below respective first, second, and third conforming layers 482a, 482b, 482c. The illustrated first, second and third base material stacks 481a, 482b, 482c are formed of multiple material layers in substantially the same manner as discussed above with respect to FIG. 6. Spacer structures 462 are subsequently formed between the first, second, and third base material stacks 481a, 482b, 482c. The first, second, and third conforming layers 482a, 482b, 482c are deposited over respective first, second, and third base material stacks 481a, 482b, 482c, and take on a shape based on the heights of the first, second, and third base material stacks 481a, 482b, 482c. The interaction between the material used to form the first, second, and third conforming layers 482a, 482b, 482c and the spacer structures 462 results in the first, second, and third conforming layers 482a, 482b, 482c having corresponding first, second, and third shapes.

As illustrated, the first conforming layer 482a has a depressed shape as a result of the first base material stack 481a having a topmost surface with a height less than a topmost surface of the adjacent spacer structures 462. Due to the surface tension of the material used to form the first conforming layer 482a, the resulting first conforming layer 482a has edges 483a that have topmost surfaces with a height h1 greater than the height h2 of a middle portion 484a of the first conforming layer 482a. The first color filter 408a directs light onto a focal plane 422a at or near to a top surface of a respective photosensitive region 404b. Although illustrated as having edges 483a that have topmost surfaces with a height h1 greater than the height h2 of a middle portion 484a of the first conforming layer 482a, this is not intended to be limiting in any way.

For example, the second pixel cell 402b includes the second color filter 408b having a second base material stack 481b that is substantially the same height h3 as the adjacent spacer structures 462. Edges 483b of the overlying second conforming layer 482b, therefore, have a height h4 lower than a height h5 associated with a middle portion 484b of the second conforming layer 482b. As a result of the surface tension inherent in the material used to form the second conforming layer 482b, the middle portion 484b of the second conforming layer 482b is substantially planar. The second color filter 408b directs light onto a focal plane 422b corresponding to a depth below a top surface of a respective photosensitive region 404g.

The third pixel cell 402c includes the third color filter 408c having a third base material stack 481c with a height greater than the adjacent spacer structures 462. As a result of the surface tension inherent in the material used to form the third conforming layer 482c, a middle portion 484b of the second conforming layer 482c has a substantially hemispherical shape. The third color filter 408c directs light onto a focal plane 422c corresponding to a depth near the p-n junction of a respective photosensitive region 404c.

It should be noted that the heights of the base material stack and spacer structures could be selected such that the conforming layers are substantially planar after deposition. The substantially planar surface would allow for an ideal platform on which microlenses could be subsequently formed. Additionally, the heights of the base material stack and spacer structures could be selected such that the conforming layers are substantially non-planar after deposition. By controlling the shapes of the underlying color filter, the focal points of deposited microlenses could be controlled to have shifted focal points relative to a center of the microlens.

Figure 10B:
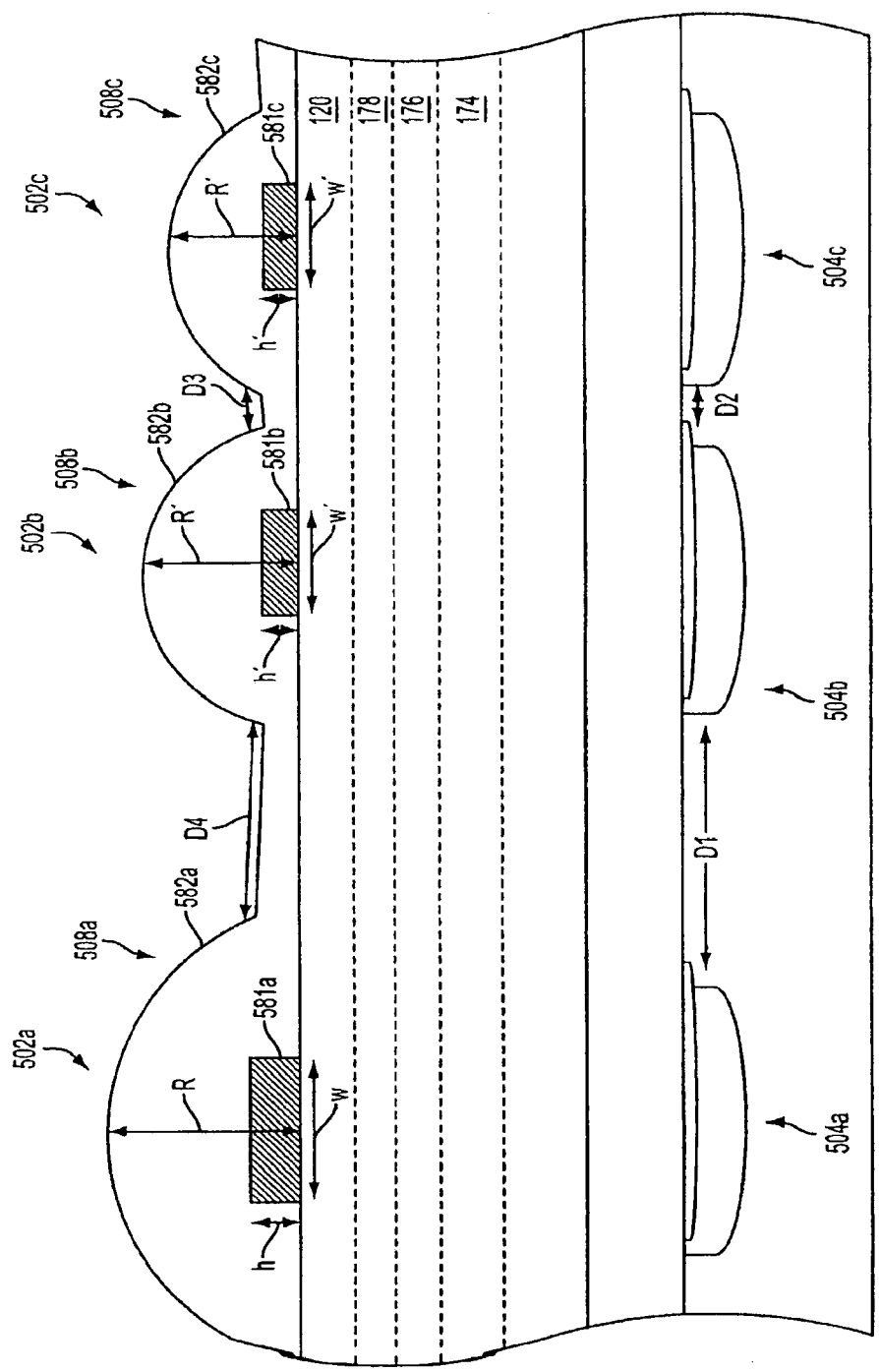

FIGS. 10A and 10B illustrate top-down and cross-sectional views, respectively, of an imager device 500 constructed in accordance with a ninth embodiment of the invention. FIG. 10A illustrates a Bayer pattern comprising first, second, and third pixel cells 502a, 502b, 502c. As illustrated in FIG. 10B, a cross-sectional view taken along line V-V of FIG. 10A, the imager device 500 includes first, second, and third pixel cells 502a, 502b, 502c having respective first, second, and third color filters photosensitive regions 504b, 504g, 5404r. The first and second photosensitive regions 504b, 504g have a first distance D1 between each other; the second and third photosensitive regions 504g, 5404r have a second distance D2 between each other. As illustrated, the first distance D1 is greater than the second distance D2. Shared pixel cell technologies typically employ asymmetrical distances between photosensitive regions of a pixel array.

Accordingly, the first second and third color filters 508a, 508b, 508c have respective first, second, and third base material layers 581a, 581b, 581c, formed below respective first, second, and third conforming layers 582a, 582b, 582c. The first, second, and third base material layers 581a, 581b, 581c are patterned over the first, second, and third photosensitive regions 504a, 504b, 504c. The first base material layer 581a has a first height h and a first width w. The second and third base material layers 581b, 581c have a second height h' that is less than the first height h and a second width w' that is less than the first width w.

The lower height h' and the smaller width w' of the second and third base material layers 581b, 581c, results in a smaller overall radius of curvature R' of the second and third color filters 508b, 508c as compared to the overall radius of curvature R associated with the first color filter 508a. The second and third color filters 508b, 508c are tailored for the underlying second and third photosensitive regions 504b, 504c. Additionally, the smaller width w' of the second and third base material layers 581b, 581c allow the second and third color filters 508b, 508c to be formed in proximity to one another. As illustrated the second and third color filters 508b, 508c have a third distance D3 from one another, corresponding to the second distance D2 between the respective photosensitive regions 504g, 5404r. The first and second color filters 508a, 508b have a fourth distance D4 from one another, corresponding to the first distance D1 of the underlying respective photosensitive regions 504b, 504c.

It should also be noted that although FIGS. 1-10B illustrate three pixel cells, it is not intended to be limiting in any way. Those skilled in the art will recognize that a plurality of pixel cells is typically fabricated in rows and columns in an array on a single substrate simultaneously. Moreover, as noted the embodiments of the invention are not limited to a pixel array employs there color pixels.

Figure 11:
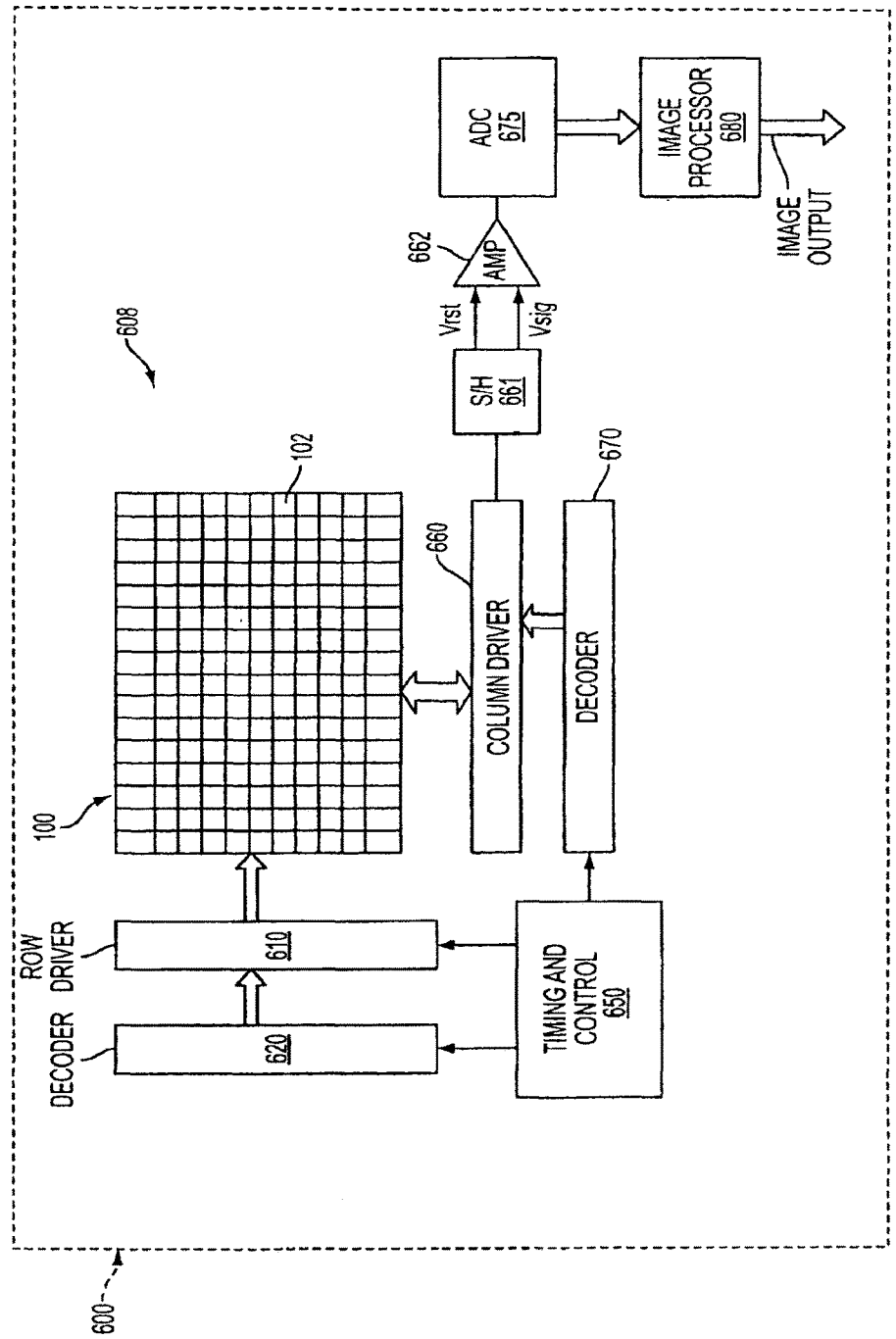
FIG. 11 is a block diagram of a device incorporating the imager device constructed in accordance with FIGS. 1A-1B.

FIG. 11 illustrates a device 608 incorporating an imager 100 constructed in accordance with the embodiments of the invention. For the sake of clarity, the imaging device will be described as including the FIG. 1 imager device 100 of FIGS. 1A and 1B; however, it should be noted that any of the embodiments described with respect to FIGS. 1A-10B could be employed for the array of imager device 100.

In operation of the FIG. 11 device 608, the pixel cells 102 of each row in the imager device 100 are all turned on at the same time by a row select line, and the pixel cells 102 of each column are selectively output by respective column select lines. A plurality of row and column lines is provided for the entire array of pixel cells. The row lines are selectively activated in sequence by the row driver 610 in response to row address decoder 620 and the column select lines are selectively activated for each row by the column driver 660 in response to column address decoder 670. Thus, a row and column address is provided for each pixel cell 102. The device 608 is operated by the control circuit 650, which controls address decoders 620, 670 for selecting the appropriate row and column lines for pixel readout, and row and column driver circuitry 610, 660, which apply driving voltage to the drive transistors of the selected row and column lines.

The pixel output signals typically include a pixel reset signal $V_{rst}$ taken off of a floating diffusion region (via a source follower transistor) when it is reset and a pixel image signal $V_{sig}$, which is taken off the floating diffusion region (via the source follower transistor) after charges generated at a photosensor by an image are transferred to it. The $V_{rst}$ and $V_{sig}$ signals are read by a sample and hold circuit 661 and are subtracted by a differential amplifier 662, which produces a difference signal ($V_{rst}-V_{sig}$) for each pixel cell 102, which represents the amount of light impinging on the pixel cell 102. This signal difference is digitized by an analog-to-digital converter (ADC) 675. The digitized pixel signals are then fed to an image processor 680 to form a digital image output. In addition, as depicted in FIG. 10, the imaging device 608 may be included on a single semiconductor chip (e.g., chip substrate 600).

Detailed descriptions of the functions of various CMOS elements of an imaging circuit are described, for example, in U.S. Pat. No. 6,140,630; U.S. Pat. No. 6,376,868; U.S. Pat. No. 6,310,366; U.S. Pat. No. 6,326,652; U.S. Pat. No. 6,204,524; U.S. Pat. No. 6,333,205; and U.S. Pat. No. 6,852,591, all of which are assigned to Micron Technology, Inc. The disclosures of each of the foregoing are hereby incorporated by reference in their entirety.

Figure 12:
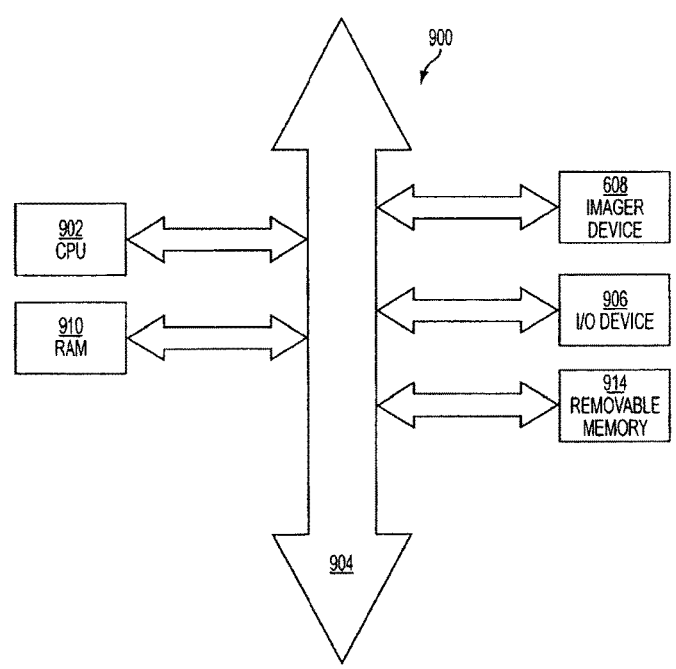
FIG. 12 is a block diagram of a processor system incorporating the FIG. 11 imaging device in accordance with an embodiment of the invention.

FIG. 12 shows a system 900, a typical processor system modified to include an imaging device (such as the FIG. 11 device 608) of the embodiments of the invention. The processor system 900 is an example of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other systems employing an imager.

System 900, for example a digital camera system, generally comprises a central processing unit (CPU) 902, such as a microprocessor which performs camera control and may also perform image providing functions, that communicates with an input/output (I/O) device 906 over a bus 904. Device 608 also communicates with the CPU 902 over the bus 904. The processor-based system 900 also includes random access memory (RAM) 910, and can include removable memory 914, such as flash memory, which also communicate with the CPU 902 over the bus 904. The device 608 may be combined on a same chip as the CPU 902, with or without memory storage, or on a different chip from the CPU 902.

It should again be noted that although the embodiments of the invention have been described with specific references to CMOS imaging devices (e.g., 100, 200, 300, 400, 500 of FIGS. 1A-10B), they have broader applicability and may be used in any imaging apparatus. For example, embodiments may be used in conjunction with charge coupled device (CCD) imagers. The above description and drawings illustrate embodiments which achieve the objects and features of the invention. Although certain advantages and embodiments have been described above, those skilled in the art will recognize that substitutions, additions, deletions, modifications and/or other changes may be made. Accordingly, the embodiments are not limited by the foregoing description but are only limited by the scope of the appended claims.

What is claimed as new and desired to be protected by Letters Patent of the United States is:

1. An imager comprising:
    a pixel cell array formed in a substrate, the pixel cell array having an array of at least first, second and third photosensors; and
    a color filter array comprising at least first, second, and third color filters corresponding to the first, second, and third photosensors, and comprising respective spaced first, second, and third blocks of base material and corresponding first, second and third shaped materials formed over the respective first, second, and third blocks of base material, the first, second, and third blocks of base materials having spacer structures between them, wherein—
       the first block of base material has a first width and a first height, and the first shaped material has a first radius positively correlated with the first width and positively correlated with the first height,
       the second block of base material has a second width and a second height, and the second shaped material has a second radius positively correlated with the second width and positively correlated with the second height, and
       the first radius is greater than the second radius.

2. An imager as in claim 1, wherein the first, second, and third base materials are arranged such that at least two of the base material blocks are in closer proximity than one of the at least two base material blocks and a third base material block.

3. An imager as in claim 1, wherein the first, second and third base materials are all clear in color.

4. The imager of claim 1 wherein the first height is greater than the second height.

5. The imager of claim 4 wherein the first width is greater than the second width.

6. An imager comprising:
    a pixel cell array formed in a substrate, the pixel cell array having an array of at least first, second and third photosensors; and
    a color filter array corresponding to the array of photosensors, and comprising respective first, second, and third base materials and corresponding first, second, and third shaped materials formed over the first, second and third base materials,
    wherein the first shaped material and at least one of the second and third shaped materials each have a radius positively correlated with a height of the corresponding base material, and
    wherein the first base material has a greater height than at least one of the second and third base materials, wherein the first shaped material has a greater size than the at least one of the second and third base materials by virtue of the positive correlation with the greater height.

7. A method of forming an imaging device, comprising:
    forming a pixel cell array in a substrate, the pixel cell array having an array of photosensors;
    forming a color filter array corresponding to the array of photosensors, each of the color filters comprising respective shaped materials formed over base layers, wherein the shaped materials are formed having a physical dimension;
    forming a coating formed over the color filter array; and
    forming spacer structures between at least two of the base materials;
    selectively etching the base layers such that (1) at least two of the base layers have different heights, wherein each of the different heights are positively correlated with the physical dimension of the shaped materials, and (2) the corresponding shaped materials formed over the at least two base layers have different sizes corresponding to the different heights.

8. The method of claim 7, wherein the conforming layers have a shape defined at least partially by the base layers and the spacer structures.

9. An imager comprising:
    a pixel cell array having first, second, and third photo sensors; and
    a color filter array comprising first, second, and third color filters corresponding to the first, second, and third photo sensors, and comprising respective first, second and third spaced apart base materials formed on a support surface and first, second, and third conforming materials respectively formed over the first, second, and third base materials such that at least a portion of each of the first and second conforming materials at least partially fill in a space between the first and second base materials and extend to the support surface;
    wherein the first base material has a first height and at least one of the second and third base materials has a second height which differs from the first height, wherein the first conforming material projects from the support surface by a first radius that is positively correlated with the first height, and wherein at least one of the second and third conforming materials projects from the support surface by a second radius that differs from the first radius.

10. The imager of claim 1 wherein the first width is greater than the second width.

11. The imager of claim 9 wherein the first cross-sectional width of the first base material is greater than the second cross-sectional width of the at least one of the second and third base materials.

12. The imager of claim 9 wherein the first radius of the first conforming material is greater than the second radius of the at least one of the second and third conforming base materials.

13. An imager comprising:
a pixel cell array formed in a substrate, the pixel cell array having an array of at least first, second and third photosensors; and
a color filter array comprising at least first, second, and third color filters corresponding to the first, second, and third photosensors, and comprising respective spaced first, second, and third blocks of base material and corresponding first, second and third shaped materials formed over the respective first, second, and third blocks of base material, the first, second, and third blocks of base materials having spacer structures between them, wherein—
the first block of base material has a first width and a first height, and the first shaped material has a first radius corresponding to the first width and first height,
the second block of base material has a second width and a second height, and the second shaped material has a second radius corresponding to the second width and second height,
the first radius is greater than the second radius, and
the first height is greater than the second height.

14. The imager of claim 13 wherein the first width is greater than the second width.

* * * * *